(12) United States Patent
Li et al.

(10) Patent No.: US 10,571,812 B2
(45) Date of Patent: Feb. 25, 2020

(54) METHOD OF CALIBRATING FOCUS MEASUREMENTS, MEASUREMENT METHOD AND METROLOGY APPARATUS, LITHOGRAPHIC SYSTEM AND DEVICE MANUFACTURING METHOD

(71) Applicant: ASML Netherlands B.V., Veldhoven (NL)

(72) Inventors: Fahong Li, Eindhoven (NL); Miguel Garcia Granda, Veldhoven (NL); Carlo Cornelis Maria Luijten, Duizel (NL); Bart Peter Bert Segers, Tessenderlo (BE); Cornelis Andreas Franciscus Johannes Van Der Poel, Helmond (NL); Frank Staals, Eindhoven (NL); Anton Bernhard Van Oosten, Lommel (BE); Mohamed Ridane, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 7 days.

(21) Appl. No.: 16/045,979

(22) Filed: Jul. 26, 2018

(65) Prior Publication Data
US 2019/0056673 A1 Feb. 21, 2019

(30) Foreign Application Priority Data
Aug. 21, 2017 (EP) .................................. 17187069

(51) Int. Cl.
*G03F 7/20* (2006.01)
*G01M 11/02* (2006.01)

(52) U.S. Cl.
CPC ......... *G03F 7/70641* (2013.01); *G01M 11/02* (2013.01)

(58) Field of Classification Search
CPC .......................... G03F 7/70641; G01M 11/02
See application file for complete search history.

(56) References Cited

U.S. PATENT DOCUMENTS

| 5,856,052 A | 1/1999 | Leroux |
| 6,208,748 B1 | 3/2001 | Troccolo et al. |

(Continued)

FOREIGN PATENT DOCUMENTS

| EP | 2 063 321 A2 | 5/2009 |
| WO | WO 2013/178422 A1 | 12/2013 |

OTHER PUBLICATIONS

Brunner et al., "Quantitative stepper metrology using the focus monitor test mask," Optical/Laser Microlithography VII, vol. 2197, May 17, 1994; pp. 541-549.

*Primary Examiner* — Jamil Ahmed
(74) *Attorney, Agent, or Firm* — Sterne, Kessler, Goldstein & Fox P.L.L.C.

(57) ABSTRACT

Focus performance of a lithographic apparatus is measured using pairs of targets that have been exposed (1110) with an aberration setting (e.g. astigmatism) that induces a relative best focus offset between them. A calibration curve (904) is obtained in advance by exposing similar targets on FEM wafers (1174, 1172). In a set-up phase, calibration curves are obtained using multiple aberration settings, and an anchor point (910) is recorded, where all the calibration curves intersect. When a new calibration curve is measured (1192), the anchor point is used to produce an adjusted updated calibration curve (1004') to cancel focus drift and optionally to measure drift of astigmatism. Another aspect of the disclosure (FIGS. 13-15) uses two aberration settings (+AST, −AST) in each measurement, reducing sensitivity to astigmatism drift. Another aspect (FIGS. 16-17) uses pairs of targets printed with relative focus offsets, by double exposure in one resist layer.

15 Claims, 14 Drawing Sheets

(56) References Cited

U.S. PATENT DOCUMENTS

| | | |
|---|---|---|
| 6,650,399 B2 | 11/2003 | Baselmans et al. |
| 2006/0033921 A1 | 2/2006 | Den Boef et al. |
| 2006/0066855 A1 | 3/2006 | Boef et al. |
| 2009/0284722 A1 | 11/2009 | Gabor et al. |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0050668 A1* | 2/2013 | Kisteman ............ G03F 7/70641 355/55 |
| 2013/0258310 A1 | 10/2013 | Smilde et al. |
| 2013/0271740 A1 | 10/2013 | Quintanilha |
| 2016/0363871 A1 | 12/2016 | Van Oosten et al. |

\* cited by examiner

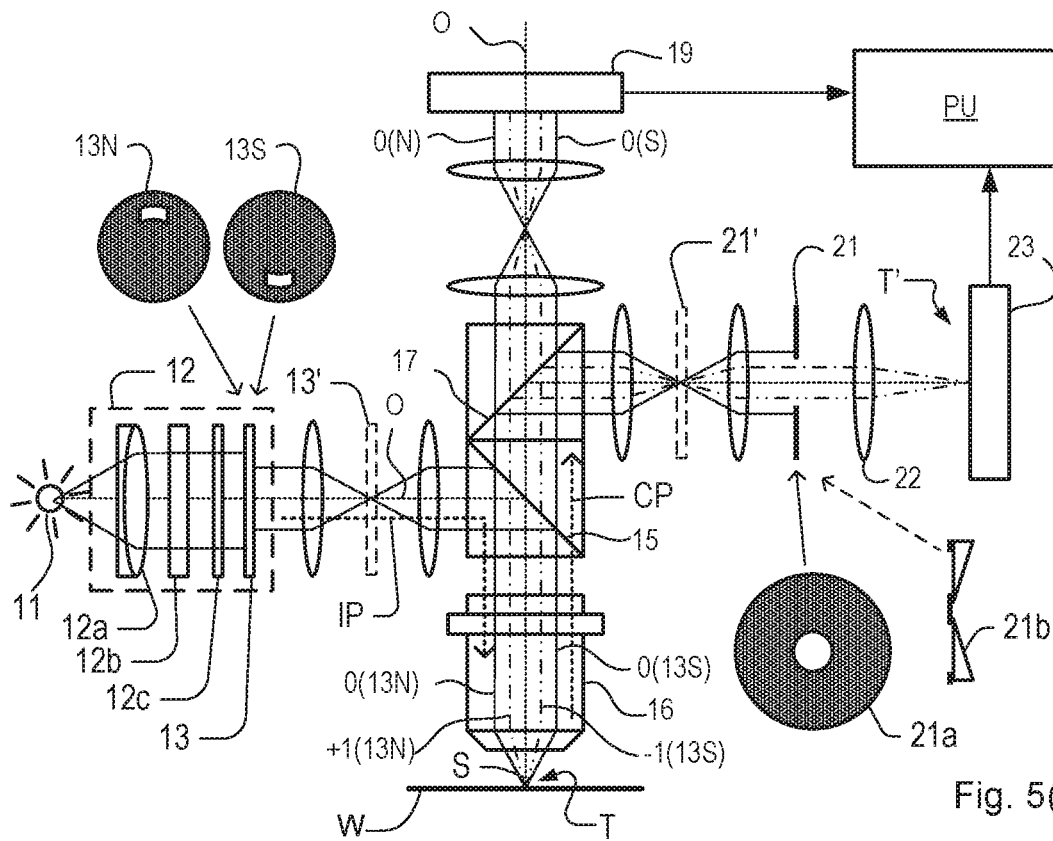
Fig. 5(a)
Fig. 5(b)
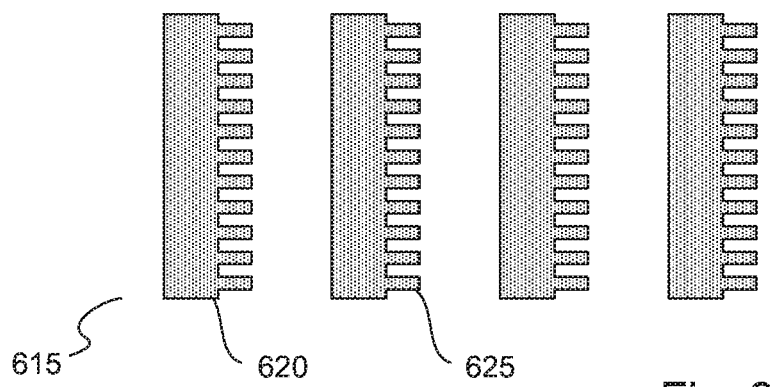
Fig. 6 (Prior Art)

METHOD OF CALIBRATING FOCUS MEASUREMENTS, MEASUREMENT METHOD AND METROLOGY APPARATUS, LITHOGRAPHIC SYSTEM AND DEVICE MANUFACTURING METHOD

BACKGROUND

Field of the Invention

The present invention relates to inspection apparatus and methods usable, for example, to perform metrology in the manufacture of devices by lithographic techniques. The invention further relates to such methods for monitoring a focus parameter in a lithographic process.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is frequently desirable to make measurements of the structures created, e.g., for process control and verification. Various tools for making such measurements are known, including scanning electron microscopes, which are often used to measure critical dimension (CD), and specialized tools to measure overlay, the accuracy of alignment between two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581 A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature. Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy settings were determined from examination of those test structures.

Current test structure designs and focus measuring methods have a number of drawbacks. Many test structures require sub-resolution features or grating structures with large pitches. Such structures may contravene design rules of the users of lithographic apparatuses. Diffraction-based focus measuring techniques are known which comprise measuring asymmetry in opposite higher (e.g., first) order radiation scattered by special, focus dependent, target structures, and determining focus from this asymmetry. For EUV lithography, resist thickness, and therefore the thickness of target structures, is smaller (for example, half as thick). Therefore, focus sensitivity and signal strength may be insufficient to use such asymmetry methods in EUV lithography. In addition, asymmetry based techniques may require careful selection of target geometries to ensure a desired relationship (e.g., linear) between asymmetry and focus. This selection process can be complex and may require significant effort to find a suitable target geometry. It may even be the case that no suitable target geometry exists.

In US2016363871A1 it was proposed to use one or more pairs of targets that have been formed with a "best focus offset" dF between the targets of a pair. A focus measurement can then be derived as a function of a diffraction signal measured on the first target and a corresponding diffraction signal measured on the second target. Special sub-resolution features are not required. A particular way to introduce a best focus offset is to print gratings with different orientations, while using a non-zero setting of astigmatism in the projection system. This astigmatism based focus measurement method, known as ABF, has become the method of choice for focus metrology in EUV lithography. ABF can be used in conventional lithography as well. The contents of US2016363871A1 are incorporated herein by reference.

SUMMARY OF THE INVENTION

In some aspects, the invention aims to improve accuracy of measurements performed by the ABF method.

In other aspects, the invention aims to measure aberration performance of a lithographic apparatus, for example astigmatism performance, independently or in combination with measurement of focus by the ABF method.

In other aspects, the invention aims to reduce the need for specialized techniques for measuring focus and aberration performance, which tend to be time consuming compared with scatterometry.

In other aspects, the invention aims to provide alternative methods for measurement of focus performance of a lithographic apparatus.

In other aspects, the invention aims to provide alternative methods for measurement of aberration performance of a lithographic apparatus. The present invention aims to address one or more of the above identified drawbacks.

The invention in a first aspect provides a method of calibrating measurements of a focus parameter of a lithographic apparatus, wherein the measurement of the focus parameter is based on measurement of at least one pair of targets printed using an aberration setting of the lithographic apparatus that induces a relative best focus offset between the targets of the pair, and being based on calibration information that expresses a relationship between said focus parameter and measurements of at least one pair of targets having a given best focus offset, said method comprising:

(a) obtaining updated calibration information by printing pairs of new calibration targets using said aberration setting in combination with different focus settings, and measuring the new calibration targets to obtain updated calibration information; and (b) identifying a drift in performance of the lithographic apparatus, based on the updated calibration information and on previously obtained calibration information, the previously obtained calibration information being obtained by measuring pairs of calibration targets printed using two or more different aberration settings so as to induce two or more different relative best focus offsets within the pairs.

In an embodiment, the previously obtained calibration information is used to identify an anchor point, being a focus setting for which the measurement of a pair of targets is invariant over said different aberration settings.

In an embodiment, the updated calibration information is adjusted to share said anchor point, and the adjusted updated calibration information for use in said measurements of focus performance.

The invention in the first aspect further provides a method of measuring focus performance of a lithographic apparatus, said method comprising:

acquiring a first measurement value, said first measurement value having been obtained from inspection of a first target of a pair of targets;

acquiring a second measurement value, said second measurement value having been obtained from inspection of a second target of the pair of targets, wherein said first target and second target have been printed by the lithographic apparatus with an aberration setting that induces a relative best focus offset between the first target and the second target; and determining a measurement of focus performance using at least said first measurement value and said second measurement value, and using adjusted updated calibration information obtained using the anchor point as set forth above.

The invention in the first aspect yet further provides a metrology apparatus for measuring a parameter of a lithographic process, the metrology apparatus being operable to perform the method of the invention as set forth above. The metrology apparatus may comprise:

a support for said substrate having a plurality of targets thereon;

an optical system for measuring each target; and a processor for receiving said first measurement, said second measurement and said adjusted updated calibration information and for determining said measurements of focus performance.

The invention in a second, independent aspect, provides a method for determining a drift of one or more performance parameters associated with a lithographic process associated with a lithographic process used to form structures on a substrate, the method comprising:

(a) measuring responses of a characteristic of a structure to a variation of a focus setting, said responses being determined for structures formed using at least two different aberration settings;

(b) at a later time, measuring again the response of said characteristic to variation of said focus setting for structures formed using at least one aberration setting; and (c) determining the drift of focus performance achieved by a given focus setting and/or aberration performance achieved by a given aberration setting, using the response measured in step (b) and the responses measured in step (a).

The invention in a third, independent aspect provides a method of monitoring a focus parameter of a lithographic apparatus, the method comprising:

receiving a first measurement value, said first measurement value having been obtained from inspection of a first target;

receiving a second measurement value, said second measurement value having been obtained from inspection of a second target, receiving a third measurement value, said third measurement value having been obtained from inspection of a third target;

receiving a fourth measurement value, said fourth measurement value having been obtained from inspection of a fourth target; and determining the focus parameter from at least said first, second, third and fourth measurement values, wherein said first target and second target have been printed using a first aberration setting of the lithographic apparatus that induces a relative best focus offset between the targets, wherein said third target and fourth target have been printed using a second aberration setting of the lithographic apparatus that has a different sign than the first aberration setting, and wherein the first, second, third and fourth measurement values are combined, so as to determine said focus parameter in a manner that is insensitive to a drift in aberration performance of the lithographic apparatus.

The invention in the third aspect further provides a metrology apparatus a metrology apparatus for measuring a parameter of a lithographic process, the metrology apparatus being operable to perform the method of the invention of the third aspect as set forth above.

The invention in a fourth, independent aspect provides a method of monitoring a focus parameter of a lithographic apparatus, the method comprising:

receiving a first measurement value, said first measurement value having been obtained from inspection of a first target;

receiving a second measurement value, said second measurement value having been obtained from inspection of a second target; and determining the focus parameter from at least said first and second measurement values, wherein said first target has been printed using a first focus offset relative to a best focus setting of the lithographic apparatus, wherein said second target has been printed using a second focus offset relative to the best focus setting of the lithographic apparatus, and wherein said first target and said second target have been printed by printing a target pattern two times in the same resist layer on a substrate, changing a focus offset and adding a positional offset so that the second target is adjacent but offset from the first target.

The invention in the fourth aspect further provides a metrology apparatus for measuring a parameter of a lithographic process, the metrology apparatus being operable to perform the method of the invention of the fourth aspect as set forth above.

The invention in a fifth, independent aspect provides a method of measuring an aberration parameter of a lithographic apparatus, the method comprising:

receiving a first measurement value, said first measurement value having been obtained from inspection of a first target;

receiving a second measurement value, said second measurement value having been obtained from inspection of a second target;

receiving a third measurement value, said third measurement value having been obtained from inspection of a third target;

receiving a fourth measurement value, said fourth measurement value having been obtained from inspection of a fourth target; and determining the aberration parameter from at least said first, second, third and fourth measurement values, wherein said first and third targets have been formed by printing said target pattern a first time in a resist layer on a substrate using a first focus offset relative to a best focus setting of the lithographic apparatus, and wherein said second and fourth targets have been formed by printing said target pattern a second time in the same resist layer using a second focus offset relative to the best focus setting of the lithographic apparatus, adding a positional offset so that the first, second, third and fourth targets are adjacent one another on the substrate.

The invention in the fifth aspect further provides a metrology apparatus for measuring an aberration parameter of a lithographic process, the metrology apparatus being operable to perform the method of the invention of the fifth aspect as set forth above.

The invention in a sixth aspect further provides a method of measuring an imaging parameter of a lithographic apparatus, the method comprising:

receiving a set of first measurement values, each of said first measurement values having been obtained by inspection of a respective one of a set of first targets;

receiving a set of second measurement values, each of said second measurement values having been obtained by inspection of a respective one of a set of second targets; and determining the imaging parameter based on at least said first set and second set of measurement values, wherein said set of first targets and said set of second targets have been formed by printing at least a first array of target pairs in a resist layer on a substrate, each target pair comprising a first target and a second target at substantially the same target location, different target pairs of the first array of target pairs having been printed at different target locations across the substrate, and wherein the step of determining said imaging parameter uses the first and second measurement values combined with knowledge of different imaging settings used by the lithographic apparatus when printing said different target pairs at said different target locations.

The invention in the sixth aspect further provides a metrology apparatus for measuring an aberration parameter of a lithographic process, the metrology apparatus being operable to perform the method of the invention of the sixth aspect as set forth above.

The invention in each of the above aspects further provides computer programs comprising processor readable instructions which, when run on suitable processor controlled apparatus, cause the processor controlled apparatus to perform the method of that aspect of the invention as set forth above. The instructions may be stored in non-transient form on a carrier.

The invention in each of the above aspects further provides methods of manufacturing devices wherein a device pattern is applied to a series of substrates using a lithographic process, the method including using that aspect of the invention to monitor focus performance and/or aberration performance of the lithographic apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5(a)-5(b) illustrate schematically an inspection apparatus adapted to perform angle-resolved scatterometry and dark-field imaging inspection methods;

FIG. 6 illustrates target forming elements on a reticle suitable for forming a grating on a substrate having focus dependent asymmetry, according to the known diffraction based focus (DBF) technique;

DETAILED DESCRIPTION OF EXEMPLARY EMBODIMENTS

Before describing embodiments of the invention in detail, it is instructive to present an example environment in which embodiments of the present invention may be implemented.

Figure 1:
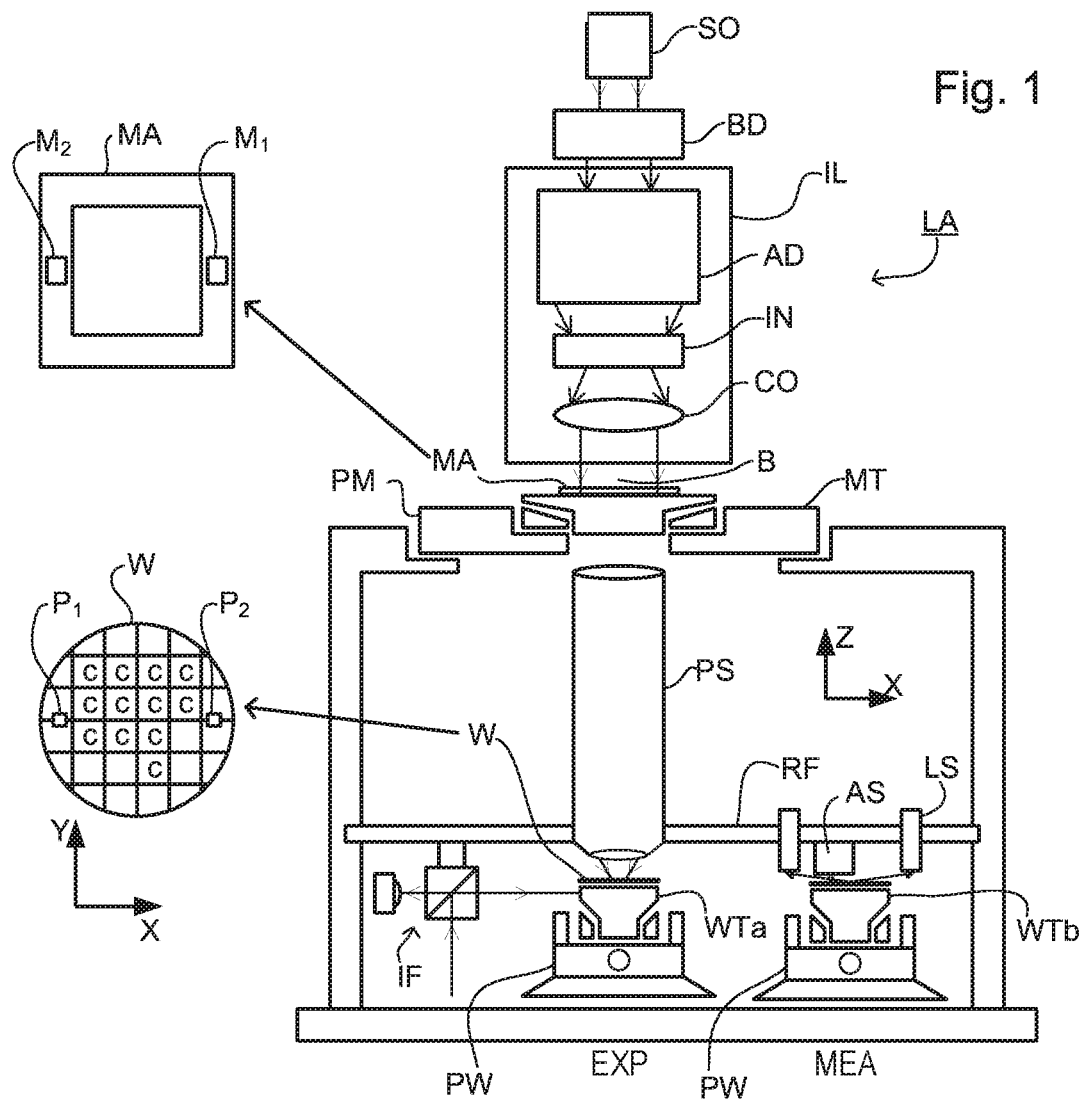
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DIN radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device, The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander, in other cases, the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below, The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
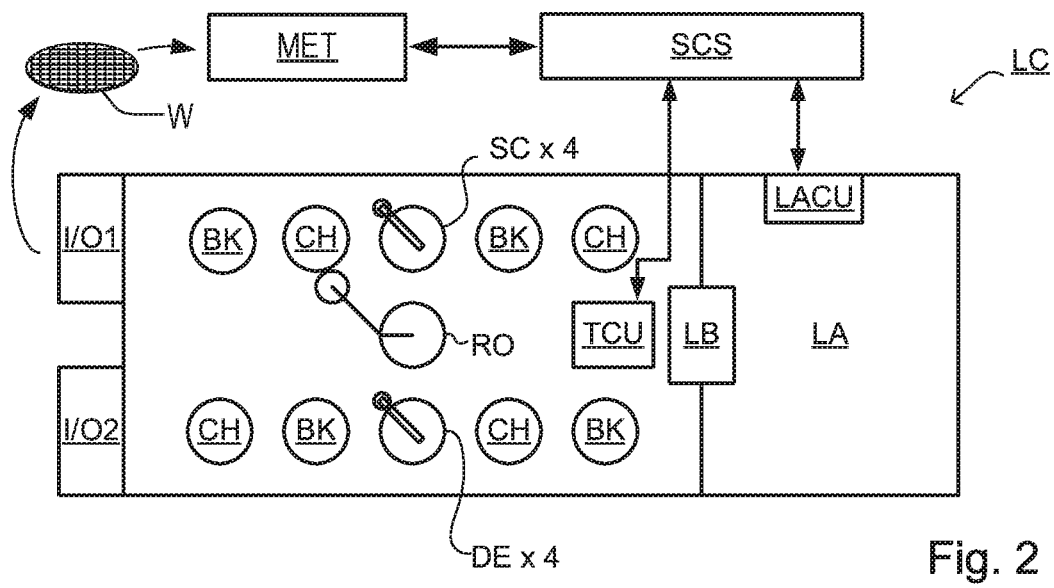
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
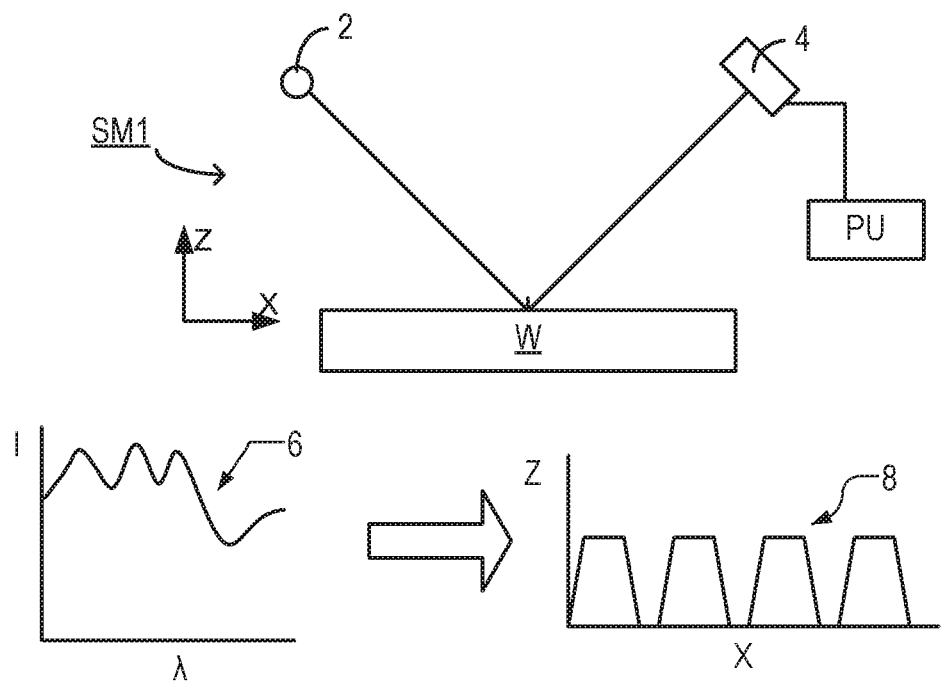
FIG. 3 illustrates the principles of operation of a spectroscopic scatterometer as a first example of an inspection apparatus.

FIG. 3 depicts a known spectroscopic scatterometer which may be used as an inspection apparatus in a metrology system of the type described above. It comprises a broadband (white light) radiation projector 2 which projects radiation onto a substrate W. The reflected radiation is passed to a spectrometer 4, which measures a spectrum 6 (intensity as a function of wavelength) of the specular reflected radiation. From this data, the structure or profile 8 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
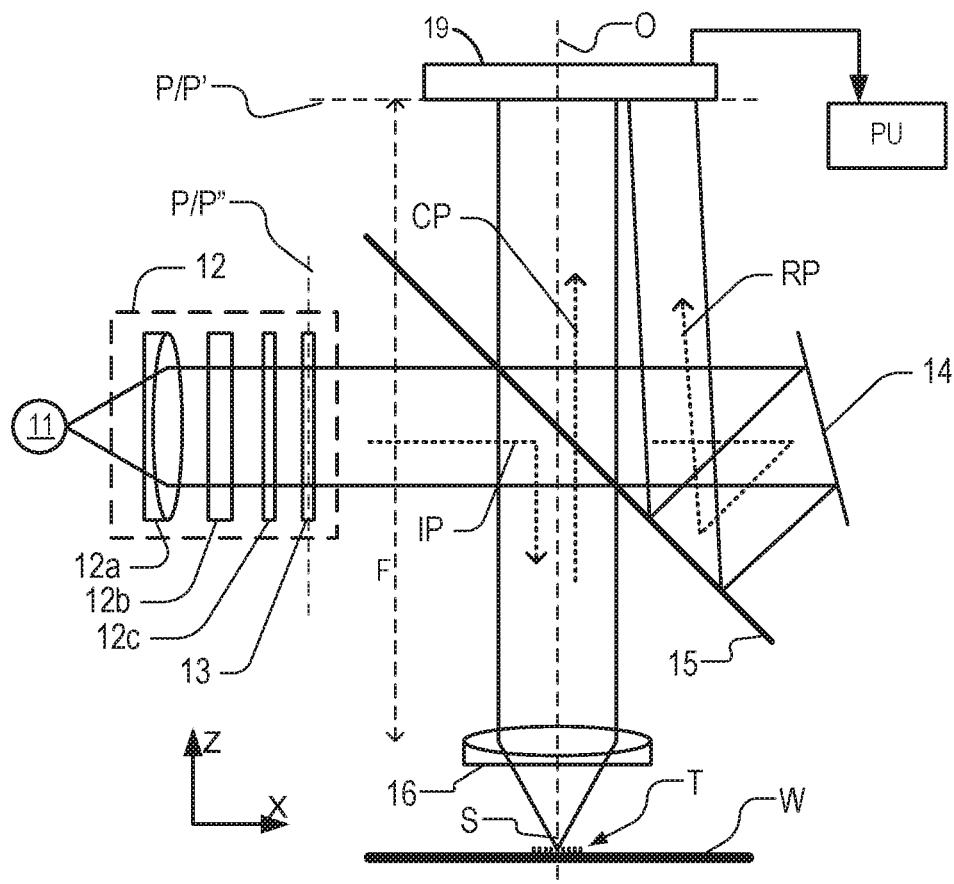
FIG. 4 illustrates in schematic form an angle-resolved scatterometer as another example of an inspection apparatus.

FIG. 4 shows the basic elements of a known angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating using lens system 12a, a color filter 12b, a polarizer 12c and an aperture device 13. The conditioned radiation follows an illumination path IP, in which it is reflected by partially reflecting surface 15 and focused into a spot S on substrate W via a Microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically, many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system being brought to different locations on the substrate, when in practice the optical system remains substantially stationary and only the substrate moves. Provided the relative position of the substrate and the optical system is correct, it does not matter in principle whether one or both of those is moving in the real world.

When the radiation beam is incident on the beam splitter 16 part of it is transmitted through the beam splitter and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the back-projected pupil plane P, which is at the focal length F of the lens 16. In practice, the pupil plane itself may be inaccessible, and may instead be re-imaged with auxiliary optics (not shown) onto the detector located in a so-called conjugate pupil plane P'. The detector is preferably a two-dimensional detector so that a two-dimensional angular scatter spectrum or diffraction spectrum of a substrate target 30 can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

The various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P''' conjugate with pupil plane P of objective lens 16 and the plane of the detector 19. In this way, an illumination profile defined by the aperture device defines the angular distribution of light incident on substrate radiation passing through different locations on aperture device 13.

The detector 19 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Where a metrology target is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

In addition to measurement of parameters by reconstruction, angle resolved scatterometry is useful in the measurement of asymmetry of features in product and/or resist patterns. A particular application of asymmetry measurement is for the measurement of a focus parameter (for example, the focus setting during exposure of the target) from targets which print with a focus dependent asymmetry. The concepts of asymmetry measurement using the instrument of FIG. 3 or 4 are described for example in published patent application US2006066855A1 cited above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 4, where detector 19 may be an image sensor, such asymmetry in the diffraction orders appears directly as asymmetry in the pupil image recorded by detector 19. This asymmetry can be measured by digital image processing in unit PU, and from this, focus can be determined.

FIG. 5(a) shows in more detail an inspection apparatus implementing angle-resolved scatterometry by the same principles as the apparatus of FIG. 4, with additional adaptations for performing so-called dark field imaging. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating T and diffracted rays are illustrated in more detail in FIG. 5(b).

The same reference numbers are used for components described already in the FIG. 4 apparatus. The illumination path is labeled IP as before. The reference path RP is omitted, for clarity. Compared with that apparatus, a second beam splitter 17 divides the collection path into two branches. In a first measurement branch, detector 19 records a scatter spectrum or diffraction spectrum of the target exactly as described above. This detector 19 may be referred to as the pupil image detector.

In the second measurement branch, imaging optical system 22 forms an image of the target on the substrate W on sensor 23 (e.g. a CCD or CMOS sensor). An aperture stop 21 is provided in a plane that is in the collection path in a plane conjugate to the pupil-plane (it may also be called a pupil stop). Aperture stop 21 can take different forms, just as the illumination aperture can take different forms. Typically, aperture stop 21 functions to block the zeroth order diffracted beam so that the image of the target formed on sensor 23 is formed only from the first order beam(s). This is the so-called dark field image, equivalent to dark field microscopy. The images captured by sensors 19 and 23 are output to image processor and controller PU, the function of which will depend on the particular type of measurements being performed.

In the illumination path in this example, additional optics are shown such that a field stop 13' can be placed in a plane conjugate with the plane of the target and the image sensor 23. This plane may be referred to as a field plane, or conjugate image plane, and has the property that each spatial position across the field plane corresponds to a position across the target. This field stop may be used for example to shape the illumination spot for a particular purpose, or simply to avoid illuminating features that are within the field of view of the apparatus but not part of the target of interest. The following drawings and discussion refer, by way of example, to techniques for implementation of the function of aperture device 13, but the present disclosure also encompasses use of the same techniques to implement the function of field stop 13'.

As shown in more detail in FIG. 5(b), target grating T is placed with substrate NV normal to the optical axis O of objective lens 16. In the case of an off-axis illumination profile, A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

Different modes of illumination are possible by using different apertures. Apertures 13N ('north') and 13S ('south') each provide off-axis illumination from a specific narrow range of angles only. Returning to FIG. 5(a), this is illustrated by designating diametrically opposite portions of the annular aperture as north (N) and south (5). The +1 diffracted rays from the north portion of the cone of illumination, which are labeled +1(13N), enter the objective lens 16, and so do the −1 diffracted rays from the south portion of the cone (labeled −1(13S)). As described in the prior applications mentioned in the introduction, using the dark-field imaging sensor 23 while switching between apertures 13N, 13S of this type is one way of obtaining asymmetry measurements from multiple small targets. Aperture stop 21a can be used to block the zeroth order radiation when using off-axis illumination.

While off-axis illumination is shown, on-axis illumination of the targets may instead be used and an aperture stop with an off-axis aperture is used to pass substantially only one first order of diffracted light to the sensor. In one example, prisms 21b are used in place of aperture stop 21 which have the effect of diverting the +1 and −1 orders to different locations on sensor 23 so that they can be detected and compared without making two images. This technique, is disclosed in the above-mentioned published patent application US2011102753A1, the contents of which are hereby incorporated by reference. 2nd, 3rd and higher order beams (not shown in FIG. 5) can be used in measurements, instead of or in addition to the first order beams.

When monitoring a lithographic process, it is desirable to monitor focus of the lithography beam on the substrate. One known method of determining the focus setting from a printed structure is by measuring the critical dimension (CD) of the printed structure. CD is a measure of the smallest feature (e.g., line width of an element). The printed structure may be a target, such as a line-space grating, formed specifically for focus monitoring. It is known that CD usually displays $2^{nd}$ order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus (due to the parabolic shape of the curve). Another drawback is that the method is insensitive to the sign of any defocus (as the curve is largely symmetrical around best focus). Also this method is sensitive, among other things, to dose and process variation (crosstalk).

To address these issues, diffraction based focus (DBF) was devised. Diffraction based focus may use target forming features on the reticle which print targets having a degree of asymmetry which is dependent on the focus setting during printing. This degree of asymmetry can then be measured using a scatterometry based inspection method, for example by measuring the intensity asymmetry between the intensities of $+1^{st}$ and $-1^{st}$ order radiation diffracted from the target, to obtain a measure of the focus setting.

FIG. 6 illustrates DBF target forming design 615 configured for diffraction based focus measurements. It comprises plural DBF structures 620, each of which comprises high resolution substructures 625. The high-resolution substructures 625 on top of a base pitch create an asymmetric resist profile for each DBF structure 620, with the degree of asymmetry being dependent upon focus. Consequently, a metrology tool can measure the degree of asymmetry from a target formed using DBF target forming design 615 and translate this into the scanner focus.

While the DBF target forming design 615 enables diffraction based focus measurements, it is not suitable for use in all situations. EUV resist film thicknesses are significantly lower than those used in immersion lithography, which makes it difficult to extract accurate asymmetry information from the asymmetric profile of the structures forming part of a target. In addition, such structures may not comply with the strict design constraints applicable to certain product structures. During the chip making process all features on the reticle must print and stand up to subsequent processing steps. Semiconductor manufacturers use design rules as a means to restrict the feature designs to ensure the printed features conform to their process requirements. An example of such a design rule relates to the allowable size of structures or pitches. Another example design rule relates to pattern density, which may restrict the density of a resulting resist pattern to be within a particular range.

It is therefore proposed to monitor focus using targets that do not rely on non-printing features that may break design rules. In US2016363871A1, mentioned above, it was proposed to use one or more pairs of targets that have been formed with a "best focus offset" dF between the two targets. As before, the focus response with a measurement value for a target parameter (for example CD or other measurements as will be described below) takes the form of a Bossung curve for each of the first and second targets. However, the best focus offset means that the two Bossung curves are offset from one another. A focus measurement can then be derived as a function of a target property as measured on the first target and the target property as measured on the second target. A specific example of how focus may be derived is described below, with reference to FIG. 7. However, the skilled person will realize that there are many alternative methods that allow focus to be extracted from the measured values obtained from the first and second targets. While the description below specifically discusses using a difference of the two measurement values (whether they be intensity values or otherwise), other mathematical operations and methods may be used to extract a focus value. For example, it is possible to divide one of the measurement values (from one of the first and second targets) into the other measurement value (from the other of the first and second targets).

Figure 7A:
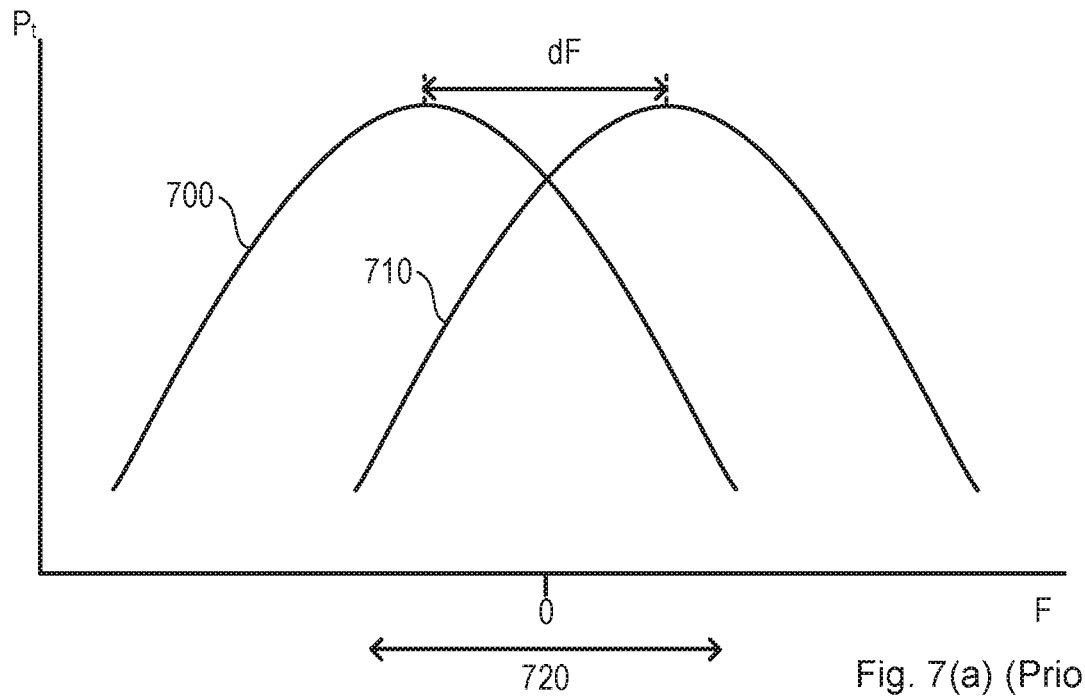
FIGS. 7(a)-7(b) show 7(a) a plot of a measured value for a target property (y-axis) against focus, for two targets having a relative best focus offset; and 7(b) a plot of the difference between measured values for a target parameter from a first target and a second target (y-axis) against focus (x-axis), these plots illustrating the ABF focus measurement method known from US2016363871A1, mentioned above.

FIG. 7(a) shows a plot of a target property $P_t$ against focus f for both the first target and second target. The target parameter could be any property of the target that can be obtained by measurement. A first Bossung curve 700 corresponds to the first target and a second Bossung curve 710 corresponds to the second target. Also shown is the best focus offset dF (the focus offset between the two peaks of Bossung curves 700, 710). The target property $P_{t1}$ for the first target and the target property $P_{t2}$ for the second target can be modeled by Bossung curves having the following equations:

$$P_{t1} = a(F - \tfrac{1}{2}dF)^2$$

$$P_{t2} = a(F + \tfrac{1}{2}dF)^2$$

Figure 7B:
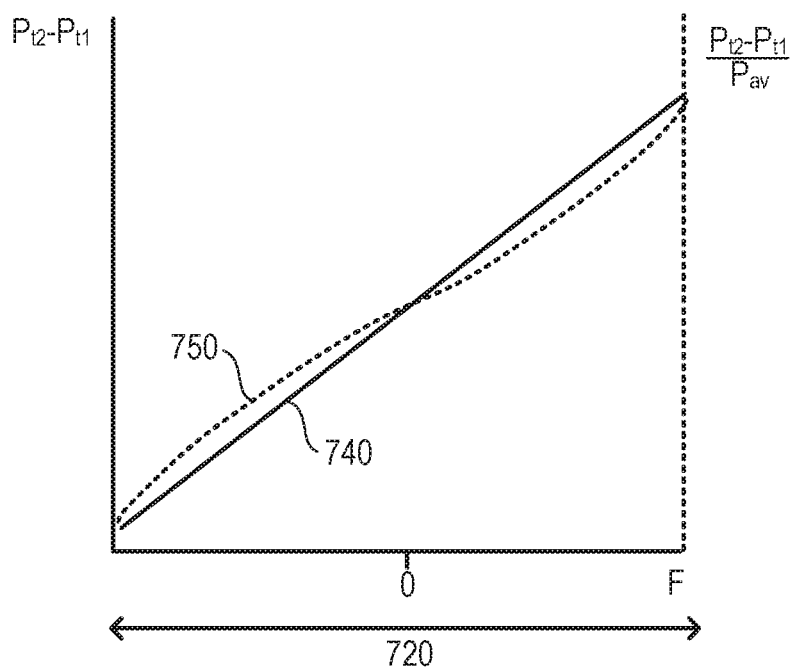

In FIG. 7(b), curve 740 is a plot of the difference $P_{t2} - P_{t1}$ between the target property for the first target and the target property for the second target, at is varies against focus. Where the Bossung curves of the targets overlap is the focus range 720, through which a difference of the target property for the first target and the target property for the second target has a monotonic, approximately linear relationship with focus. As can be seen, the relationship 740 is linear. The $P_{t2} - P_{t1}$ metric may be sensitive to crosstalk, e.g. by dose and/or process. A more robust metric may be $(P_{t2} - P_{t1})/P_{tAV}$, where $P_{tAV}$ is the average of $P_{t2}$ and $P_{t1}$. The relationship 750 (dotted) of $(P_{t2} - P_{t1})/P_{tAV}$ with focus is also shown in FIG. 7(b). This relationship is also monotonic and sufficiently linear, while being more robust against crosstalk.

In the specific example illustrated, the slope of relationship 740 or relationship 750 can be described by $2 \cdot dF \cdot a$ where dF is the best focus offset and a is the Bossung curvature. Accordingly, focus F can be obtained from the following equation (Equation 1):

$$F = \frac{P_{t2} - P_{t1}}{2 \cdot dF \cdot a \cdot P_{tAV}}$$

where $P_{tAV}$ in the denominator is optional.

In the embodiments of interest for the present disclosure, the best focus offset is introduced between two targets by printing those targets using a deliberate aberration of the lithographic apparatus. A deliberate non-zero setting of an aberration parameter can be applied, which combines with differences in the design between the targets of the pair to induce the best focus offset. As described in US2016363871A1 the best focus offset between the first target and second target can be introduced in one implementation by printing the pair of targets using a deliberate, controlled astigmatism as an example of such an aberration parameter. The astigmatism in normal operation would be controlled to be as close as possible to zero. However, a deliberate non-zero astigmatism may be introduced to the projection optics via a number of manipulators included within the projection optics. The projection lenses in many lithographic apparatuses enable a sufficiently large astigmatism offset to create a best focus offset, without unwanted wavefront effects. This astigmatism will introduce a difference in focal distances for features in different orientations. In an embodiment, the astigmatism may introduce a best focus offset between horizontal and vertical features. To exploit this, the first and second targets may comprise respectively a horizontal grating and a vertical grating (or vice versa). It will be understood that the terms "horizontal" and "vertical" in this context refer only to features oriented orthogonally to one another in the plane of the substrate. No reference to any particular orientation with respect to any external reference frame or to gravity is implied.

Referring again to FIG. 7, the curve 700 may represent a property $P_t$ of a horizontal grating while the curve 710 represents the same property of the vertical grating. The relative best focus offset dF between the two gratings depends then on the amount of astigmatism. To increase focus sensitivity, it is possible to increase the best focus offset by increasing the astigmatism setting, thereby increasing the slope of relationship 740 or relationship 750.

In the above discussion, it should be appreciated that any target property $P_t$ can be used provided it has a Bossung curve response with focus. The method of US2016363871A1 uses intensity signals obtained from diffraction orders of radiation scattered by the first target and second target to determine focus. In particular, it is proposed to use intensity values of a single diffraction order from each of the first and second targets to determine focus. The proposed method may use intensity values from corresponding diffraction orders of the first and second targets. For example, the intensity values could be that of the $+1^{st}$ (or $-1^{st}$) diffraction orders from the first and second targets. Alternatively, or in combination, the intensity values could be that of the zeroth diffraction orders from the first and second targets.

In a specific example of such a method, it is proposed to use the difference dI in the measured intensity of a diffraction order of radiation scattered by the first target and the measured intensity of the corresponding diffraction order of radiation scattered by the second target. This difference is hereafter referred to as the "dI metric", and is an example of the more generic different $P_{t2}-P_{t1}$ referred to above. However, the dI metric may be any metric that has the effect of comparing diffraction intensities from the first and second targets (e.g., by dividing one of the intensity values into the other, rather than subtracting). This is very different from the known DBF methods, where opposite diffraction orders from the same target are compared to obtain measurements of asymmetry of that target.

Using a dI metric in this way provides focus measurements with good signal strength and signal-to noise response, even when the targets comprise shallow gratings (e.g., for use in EUV lithography).

As mentioned above, the dI metric may comprise the difference of the zeroth orders of radiation scattered by the first and second targets. In this way, targets with smaller pitches can be used. Consequently, target pitch for the first and second targets can be chosen to agree with any design rules. Also, smaller target pitches mean that the overall target size can be reduced. Multiple pitches are also possible.

Where first order diffracted radiation is used, and since only a single first order is required per measurement, the pitch required to use first order radiation light is reduced to $\lambda/2$ (where $\lambda$ is the detection wavelength) in the limit of numerical aperture NA=1. At present this limit is $\lambda$. This will mean that the linear target dimension can be reduced by a factor of 2 and the real estate by a factor of 4. Particularly in an embodiment where the inspection apparatus allows both + and − diffraction orders to be captured at the same time, calculations can combine measurements using both orders, for additional confidence.

Figure 8A:
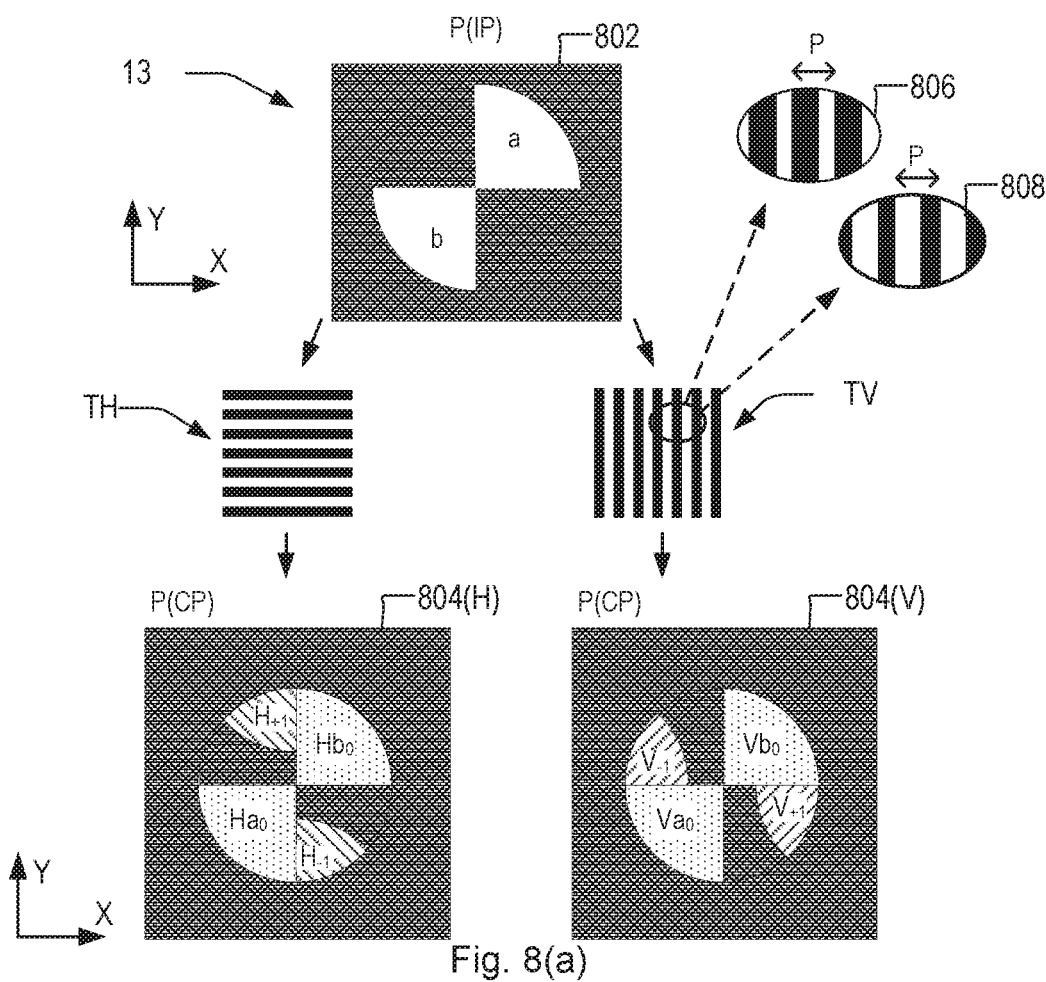
FIGS. 8(a)-8(c) illustrate 8(a) the process of obtaining diffraction signals from a pair of targets comprising a horizontal grating and a vertical grating using the scatterometer of FIG. 3 or 5(a)-5(b), and 8(b) a plot of a diffraction signal that might be obtain for the pair of targets with varying focus, and 8(c) a difference metric obtained from the diffraction signals of FIG. 8(b) for use in calculating a focus measurement.

FIG. 8(a) illustrates such an embodiment, in which a scatterometer of the type illustrated in FIG. 5 is used to capture positive and negative diffraction orders from horizontal grating TH and vertical grating TV. These gratings are targets that have been printed on a substrate using an astigmatism setting that induces a relative best focus offset dF between them. The distribution of illumination in a pupil plane of the illumination path IP is illustrated at 802. A segmented aperture device 13 is used in place of the unipolar apertures 13S and 13N shown in FIG. 5. The principles of using such a segmented aperture are disclosed in patent application US2010201963A1, and they will be described only briefly here. As is seen, this segmented illumination profile has two bright segments labeled a and b, that are 180-degree symmetrical to one another. In the X and Y directions from each bright segment the distribution is dark. These directions X and Y correspond to the directions of periodicity of the vertical grating TV and the horizontal grating TH, respectively.

When the segmented illumination profile 802 is used to form spot S on the horizontal grating TH, the distribution of radiation in the pupil plane of the collection path CP becomes as shown at 804(H). The bright regions $Ha_0$ and $Hb_0$ represent zero order diffraction signals from the target, while regions $H_{+1}$ and $H_{-1}$ represent +1 and −1 order diffraction signals which have been diffracted in the Y direction which is the direction of periodicity of the horizontal grating TH. When the same segmented illumination profile 802 is used to form spot S on the vertical grating TV, the distribution of radiation in the pupil plane of the collection path CP becomes as shown at 804(V). The bright regions $Va_0$ and $Vb_0$ represent zero order diffraction signals from the target, while regions $V_{+1}$ and $V_{-1}$ represent +1 and −1 order diffraction signals which have been diffracted in the X direction, which is the direction of periodicity of the vertical grating TV.

As illustrated in the inset details 806 and 808, the gratings that form the first and second targets may be designed to have an unequal line-space ratio, also known as duty cycle. The spatial period or pitch P of the grating is the same in both designs, but the design 806 has the lines broader than the spaces, while the design 808 has the lines narrower than the spaces. A design may be described by parameters of pitch P and linewidth CD, which can conveniently be written together in a CD/pitch ratio. For example, a grating design 806 with period 600 nm and linewidth 450 nm can be described by a CD/pitch ratio of 450/600 grating design, while a grating design 808 with a period 600 nm and linewidth 150 nm can be described by a CD/pitch ratio of 150/600. In another design with pitch 450 nm, similar duty cycles can be expressed as a CD/pitch ratio of 375/450, or 75/450.

In general, one would not use targets with duty cycles near 50% (e.g. 300/300) as they typically show low sensitivity to focus variations (due lack of Bossung curvature)), and therefore provide only a weak focus signal. However, there are cases where a 50% duty cycle does work, particularly if one customizes the exposure dose to achieve a larger focus sensitivity (effectively this is an alternative to the use of low duty-cycle focus targets)

Figures 8B, 8C:
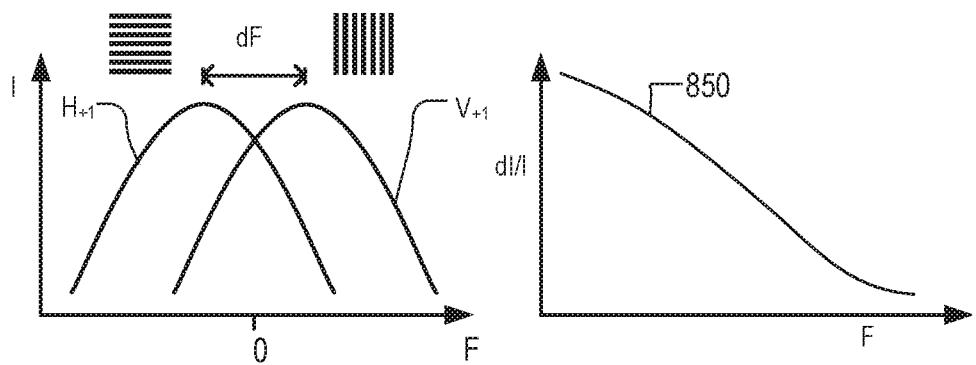

FIG. 8(b) illustrates the Bossung curves underlying the response of a particular diffraction signal, in this case the +1 order, for the pair of targets TH and TV, under a particular astigmatism setting. FIG. 8(c) illustrates the dI metric, more specifically the normalized dI metric or dI/I, that results from the difference between the two Bossung curves over a certain focus measurement range. This dI metric curve 850 corresponds to the curve 750 of FIG. 7. The slope of the curve 850 is downward instead of upward, but this is insignificant as long as it is monotonic. The sign of the best focus offset dF, and consequently the direction of the slope of the curve 750/850 depends somewhat arbitrarily on the selection of diffraction orders, the sign of the astigmatism setting, and the order which the subtraction or division is performed to obtain the dI metric.

Before using the method of FIGS. 7 & 8 to measure focus in a given situation, a calibration water or wafer will be exposed in which numerous identical target patterns are printed with different, known values of focus error and dose error. This type of wafer is well-known and called an FEM (focus-exposure matrix) wafer, described for example in patent U.S. Pat. No. 5,856,052 (Leroux), the contents of which are incorporated herein by reference. Plotting the dI metric obtained by measuring pairs of targets that have been printed with this range of known focus errors yields the curve 850, which is then stored as a calibration curve for future focus metrology on wafers that are not FEM wafers but are printed with nominally best focus. The FEM wafers can be exposed with randomized focus and dose variations, which help to remove systematic errors from the calibration. Any desired scheme can be used. The following examples assume a "Full Field Random" FEM (FFRFEM) scheme, where the full reticle image is exposed completely in a field. Alternatively, a Small Field Random FEM can be used, where the reticle image is partially exposed in a field.

Depending on the method and target design, a given focus metrology method may be applicable on product wafers, or only on monitor wafers that are processed exclusively for performance measurement and advanced process control. A focus metrology technique may additionally be applicable on "send-ahead" wafers, which are product wafers selected for patterning, in advance of processing the Whole lot of wafers. The send-ahead wafers are developed and measured after exposure, then are stripped and coated with fresh resist for processing along with the other wafers of the lot. While the DBF method of FIG. 6 can be performed at the same time as printing product features, the astigmatism-based method of FIG. 8 (ABF, for short) relies on aberration settings that typically are unsuitable for printing product wafers. The ABF method is therefore a technique better suited to dedicated monitor wafers, or to send-ahead wafers.

In this way, it is known to use the ABF method as presented in published patent application US2016363871A1 to measure the focus error of scanner-type lithographic apparatus. The astigmatism affects the two gratings TH and VH differently. Theoretically, the Bossung of the gratings as measured by the first order diffraction signal and/or other signals from the scatterometer will move away from each other as shown in FIG. 8(*b*) and the distance dF between the Bossung tops is proportional to the set value of astigmatism. An astigmatism control parameter is used to apply the aberration setting while printing target patterns from a reticle MA comprising both horizontal and vertical gratings of the same pitch. A particular parameter known as Z5 (Zernike coefficient 5) is a dominant contributor to astigmatism, but other coefficients are also related to astigmatism, for example Z12. Rather than control these minor parameters independently, it is convenient in practice to define a single "astigmatism" control parameter which is a linear combination of Z5 and the other coefficients such as Z12 having a minor weighting.

Scatterometry using the apparatus of FIG. 5 and the ABF method of FIG. 8 allows focus measurement with high precision and throughput. Currently, the ABF method is used to measure focus for monitoring performance and applying advanced process control corrections in EUV-based lithographic manufacturing.

It can be shown that the slope of the thus obtained calibration curve is proportional to the amount of astigmatism (primarily coefficient Z5) present on the scanner during exposure. In practice, this is the combined amount of astigmatism that is injected, plus the already existing scanner residual astigmatism level.

Correction and Measurement of Astigmatism Drift

The ABF method is convenient in high-volume manufacturing. However, it assumes that the aberration (astigmatism) actually achieved by a certain aberration setting is constant over time. In practice, drift of astigmatism and focus may occur in a given lithographic apparatus. This drift is undesired, because it affects the accuracy of ABF-determined focus. Some aspects of the present disclosure aim to allow this drift to be monitored so that proper measures can be taken on the scanner before the astigmatism and focus drift too much. Additionally, accurate measurement of astigmatism drift will allow better knowledge of an astigmatism "fingerprint", in other words variation of astigmatism across the slit of patterned radiation during a scanning exposure. This allows better measurement of a focus fingerprint across the slit, and allows better correction to achieve focus uniformity. An astigmatism parameter can be directly determined at calibration time as the focus shift between the two first order Bossung curves, measured across the FEM wafer. This can be done at various slit positions, taking care of curvature and higher order variations over slit.

Different methods can be used to monitor astigmatism and identify any drift. The ILIAS sensor, disclosed in patent U.S. Pat. No. 6,650,399, can be used to measure the astigmatism and other aberration parameters of the projection system PS. However, such a sensor may not always be available, and it would be interesting to be able to monitor the aberration parameter without reliance on other sensors. These other sensors may themselves be subject to drift, for example due to contamination in the RN system environment. The contents of U.S. Pat. No. 6,650,399 are incorporated herein by reference.

In addition, independent methods for measuring focus accuracy are available, such as the FOCAL method described in European patent application EP 2063321 A2. Periodic FOCAL tests can be used to measure astigmatism. FOCAL can also be used to measure the mean focus, which snakes the monitoring of focus and astigmatism possible. However, FOCAL readout can take a lot of time, reducing availability of the expensive lithographic apparatus. The contents of EP 2063321 A2 are incorporated herein by reference.

In this section of the present disclosure we describe an alternative way of monitoring these drifts, which uses scatterometry. The disclosed methods can be used for example to monitor drift frequently, so that measurements using FOCAL are required only in a set-up phase and occasionally thereafter.

In a later section of the present disclosure, we describe further alternative ways of measuring drift and also intrafield and interfield fingerprints, further reducing, or even eliminating, the need for the methods such as FOCAL which consumed time on the lithographic apparatus (see description of FIGS. 18 and 19).

Referring again to FIG. 8(c), it is desired that the shape and position of the calibration curve 850 do not change through time. In reality, it has been observed that the calibration curve changes its shape and position through time. Obviously, this in principle makes the calibration unreliable, and consequently the focus fingerprints determined using the ABF method become unreliable also. One reason for this change of the shape is thought to be due to the drift of astigmatism. As astigmatism increases or decreases, so the slope of the actual response will increase or decrease, relative to a stored calibration curve.

Figure 9:
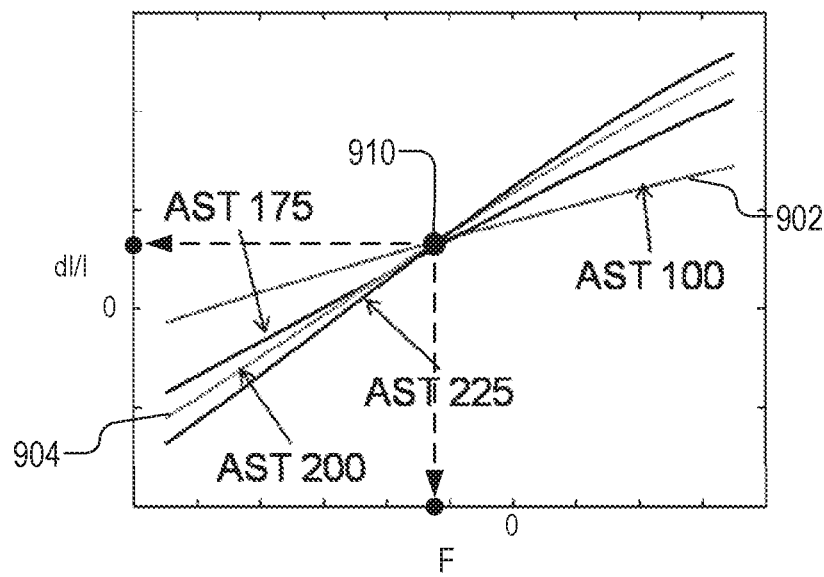
FIG. 9 illustrates the existence of an anchor point in the calibration curves for different aberration settings in the ABF method of focus measurement.

As shown in FIG. 9, studies have shown the existence of a common "anchor point" which remains stable for the differently-sloped curves created at different astigmatism values. It is proposed herein to obtain additional calibration information by measuring pairs of calibration targets printed using two or more different aberration settings and identifying the anchor point for future reference. This additional calibration information can be used for example to distinguish between the effect of focus drifts and astigmatism drifts.

In the figure, each curve 902, 904 etc. is obtained by printing multiple pairs of targets in an FFRFEM wafer as described above. AST100 means that the astigmatism setting used in the FFRFEM wafer exposure was 100 nm, AST175 means it was 175 nm and so on. These curves are captured when the set-up of the lithographic apparatus is freshly verified, for example by use of FOCAL and/or ILIAS methods. One of these astigmatism settings, for example 200 nm is selected as the setting for ABF measurements during future operation of the lithographic apparatus, and the corresponding curve 904 is stored as the calibration curve for use in those measurements. The anchor point 910 is identified by its coordinates, marked by dots on the measurement axis (dI/I) and the focus axis F. The anchor point coordinates are then stored as additional calibration information for use as described below.

Figure 10A:
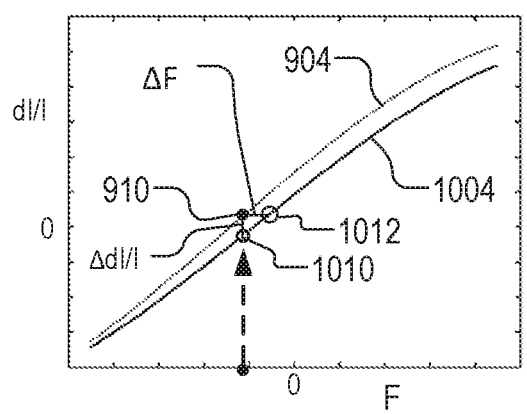
FIGS. 10(a) and 10(b) illustrate the use of the anchor point and a reference calibration curve in combination with an updated calibration curve for improving accuracy in the ABF method.

Referring now to FIG. 10(a)), the curve 904 obtained in an original calibration process similar to that shown in FIG. 9 is shown as a reference curve. (The coordinates of the anchor point 910 are not the same as in FIG. 9 only because the measurements in FIG. 10 have been made on a different process.) An updated calibration curve 1004 has been obtained by exposing a new FFRFEM wafer with the same astigmatism setting 200 nm. The change of the position of the calibration curve 1004 relative to reference curve 904 is due to a focus drift of the lithographic apparatus, meaning that focus actually achieved no longer corresponds exactly to the set 'focus. In the figure, this results in a horizontal shift of the calibration curves.

Figure 10B:
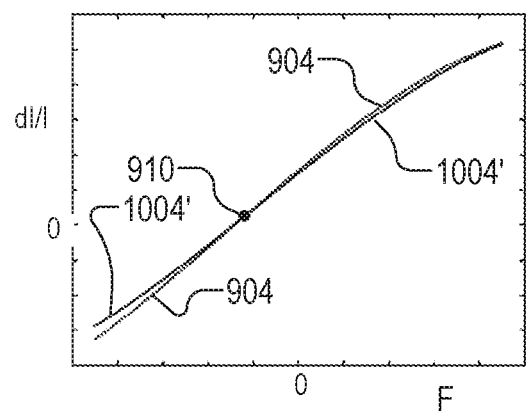

By comparing the updated calibration curve 1004 with the reference curve 904 and the anchor point 910, not only this focus drift, but also changes of shape caused by astigmatism drift can be identified without the need for other instruments and procedures. As shown in FIG. 10(b), the updated calibration curve 1004 can be adjusted to a new position 1004' by shifting it to pass through the anchor point 910. The amount of adjustment required provides (directly or indirectly) a measure of the amount of focus drift that has occurred since the calibration measurements shown in FIG. 9 were made. Implementation of these steps will be described in more detail below.

As can also be seen, even after its position has been adjusted, the updated calibration curve 1004' still does not follow exactly the reference curve 904, due to a change of shape. A quantitative measure of astigmatism drift can then be obtained based on this change in shape. Experiments have been performed that values for best focus and astigmatism obtained in this way correlate well with independent FOCAL measurements. The measurement of astigmatism in this way avoids the need for independent measurement using for example an ILIAS sensor, and is unaffected by inaccuracies and drift in such a sensor.

Figure 11:
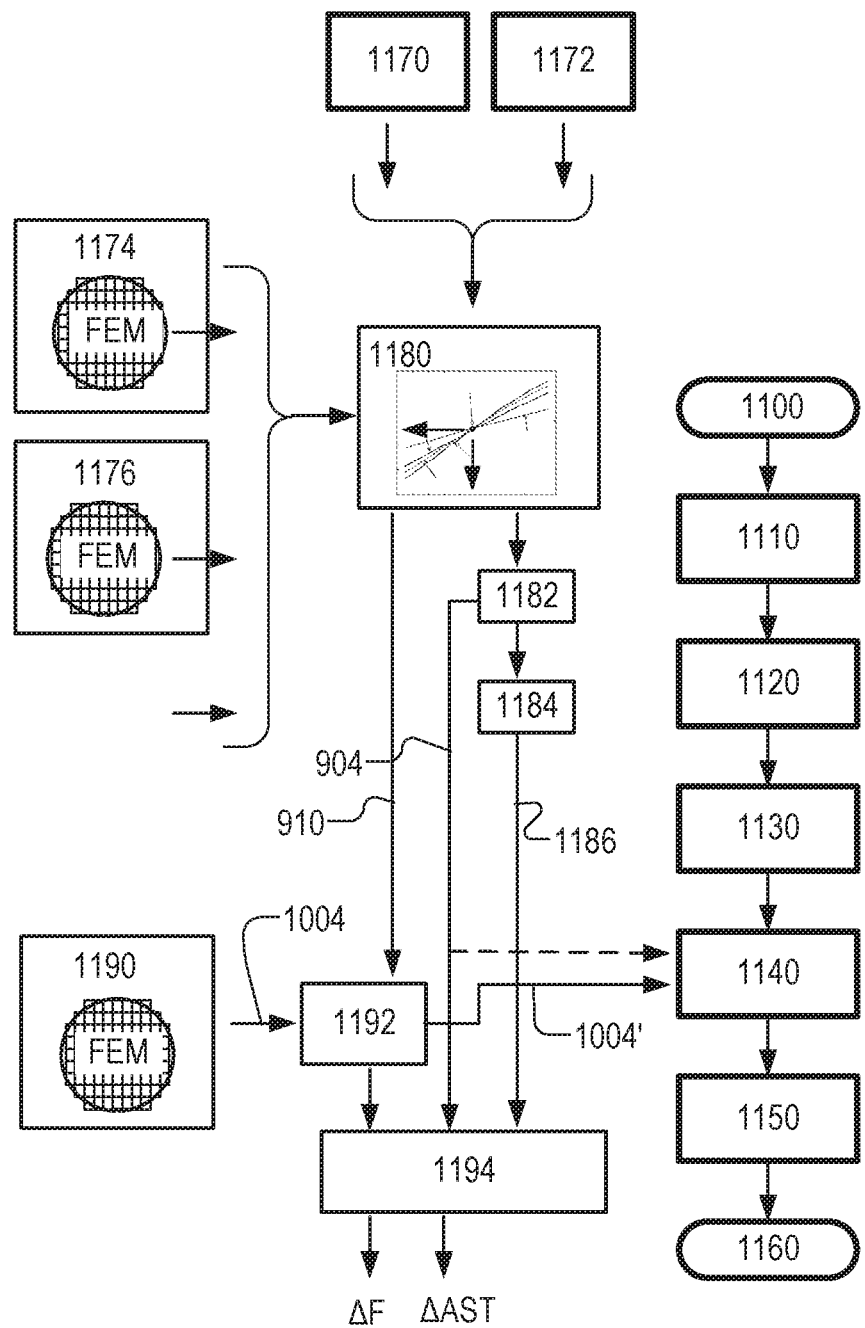
FIG. 11 is a flowchart of the ABF method, in an embodiment modified with improved calibration based on the principles of the first and second aspects of the present invention.

FIG. 11 is a flowchart of the steps of a method for monitoring a focus parameter during a lithographic process according to an exemplary embodiment. The calibration method that supports these steps will then be described. The steps are as follows, and are then described in greater detail thereafter:

1100—Start.

1111—Print first and second targets with a non-zero aberration setting, thereby to induce relative best focus offset;

1120—Perform first measurement from inspection of the first target to obtain first measurement value;

1130—Perform second measurement from inspection of second target to obtain second measurement value;

1140—Calculate focus from difference of first measurement value and second measurement value, using calibration information;

1150—Use calculated focus measurement in focus setting for subsequent exposures.

1160—End.

At step 1111, first and second targets (at least) are printed with a relative best focus offset as already described. The relative best focus offset may be introduced, for example, via a relative depth offset on the reticle between the target forming structures which form the first and second targets. Alternatively, relative best focus offset may be introduced via a non-zero aberration setting that induces an aberration such as astigmatism in the projection optics of the lithographic system.

At step 1120, a first measurement is performed from inspection of the first target to obtain a first measurement value for a target parameter. In an embodiment, this first measurement may be of the intensity (or related parameter) of one of the diffraction orders of radiation scattered by the first target. This first measurement may be obtained using any of the scatterometer devices described herein, for example. It is also contemplated within the scope of this disclosure that the first measurement be a CD measurement (whether obtained using a scatterometer, scanning electron microscope or other suitable device) or any other measurement of a parameter which has a Bossung curve relationship with focus.

At step 1130, a second measurement is performed from inspection of the second target to obtain a second measurement value for a target parameter. This second measurement should be performed using the same method as the first measurement. Where the first measurement is of the intensity (or related parameter) of one of the diffraction orders of radiation scattered by the first target, the second measurement should be of the same diffraction order of radiation scattered by the second target. The diffraction order may be either of the first diffraction orders or the zeroth diffraction order. However, higher diffraction orders can also be used and are within the scope of the disclosure. Further measurements may be made if there are more than two targets printed. These additional targets may each comprise best focus offsets that are different to that of said first target and/or said second target.

For simplicity for the purposes of the present example, it may be envisaged that the steps 1120 are 1130 are performed sequentially, using the pupil image sensor 19 of the scatterometer of FIG. 5 to acquire diffraction pupil images like those shown in FIG. 8. In other embodiments, however, step 1120 and step 1130 may be performed as a single step such that the first measurement value and second measurement value are obtained in a single acquisition. In addition, where there are more than one pair of targets being measured, two or more pairs may be measured in a single acquisition to obtain a corresponding number of measurement values. Two pairs of gratings having different pitches can be useful in adding diversity to the measurement, for example, making the method more robust against process variations other than focus.

In a specific example, a measurement device, such as that illustrated in FIG. 5, can be used to measure a composite target comprising multiple individual targets (individual periodic structures or gratings) using the imaging optical system 22 and sensor 23. The gratings of the composite target may be positioned closely together so that they will all be within an image field or measurement spot formed by the illumination beam of the metrology apparatus. In this way, the gratings can be all simultaneously illuminated and simultaneously imaged on the imaging branch detector 23. These images can then be processed to identify the separate images of the gratings, and extract diffraction signals for each grating from these images.

At step 1140, the focus error affecting each target pair is calculated from the first and second measurement values. This calculation can be performed using the dI metric, as described above. A stored calibration curve is used to translate the dI metric into a focus error measurement. Where more than one pair of targets is measured, and/or more than one diffraction order for each pair of targets, these can be combined to improve accuracy.

At step 1150, the calculated focus can then be used in focus parameter monitoring during subsequent lithographic processes, so as to maintain focus accuracy and consistency during exposure.

It will be understood that the above steps are typically applied in parallel to numerous targets distributed across a field and across a substrate, to measure a focus "fingerprint" of the lithographic apparatus.

Alongside the steps 1100-1150, the flowchart illustrates the main steps in a method of calibrating the focus measurement method. In preliminary steps 1170 and 1172, measurements of focus performance and astigmatism are made using methods and sensors other than the scatterometer that is used in steps 1120 and 1130. This may include for example the FOCAL and ILIAS methods, mentioned above.

In a recipe set-up phase, at least two FFRFEM wafers with different astigmatism values are exposed in steps 1174, 1176 etc. to obtain a plurality of calibration curves 902, 904 etc. In step 1180 the calibration curves obtained in steps 1174, 1176 etc. are compared as shown in FIG. 9 to determine the anchor point 910. Theoretically, calibration curves of different astigmatism cross each other at the same point, and this is also proven by real data. Parameters defining anchor point 910 are saved for later use.

At 1182 a reference calibration curve is selected, which is curve 904 in the example above. Astigmatism and/or focus drift will be calculated with respect to this reference calibration curve. This reference curve may also be used initially in step 1140, as shown by the dashed line.

In step 1184 a mathematical model 1186 may be created for astigmatism drift calculation, based on the set of calibration curves obtained in steps 1174-1176 etc. A key performance indicator (KPI) may be defined which is used for optimizing the measurement recipes. One suitable KPI is astigmatism cross-talk, which indicates the focus measurement error per unit (e.g. per nanometer) change of the astigmatism. The model then is a correlation between astigmatism cross-talk and astigmatism. A polynomial model can be used to do the fitting in case there are more than 2 data points. Otherwise, a linear fitting can also be used. There are two or more FFRFEM wafers with different astigmatism values exposed in the ABF setup steps 1174, 1176 etc., and the data points from the FFRFEM wafers can be used to create the model.

From this step onwards, the method enters the monitoring phase, represented by steps 1190 to 1194. In step 1190, which may be repeated periodically as part of a monitoring process, a new calibration wafer is exposed and an updated calibration curve 1004 is measured from it. The astigmatism setting used to print the pairs of targets in the new calibration wafer is the same as that used to obtain the reference calibration curve 904 in the previously obtained calibration data. It is not necessary in this monitoring phase to keep making calibration wafers with different aberration settings.

At 1192, the anchor point information 910 is used to determine whether a drift in performance has occurred since the reference curve was produced. If the new calibration curve 1004 does not pass through the anchor point, a drift in performance has been identified. The anchor point information 910 can be used to produce an adjusted version 1004' of the updated calibration curve, for use in focus measurement step 1140. There are different ways to make the adjusted version of the updated calibration curve.

In one implementation, the stored focus coordinate of the anchor point 910 is used to identify a point 1010 on the updated calibration curve 1004. The updated calibration curve 1004 is then shifted up or down until it shares the anchor point with the reference curve. This gives the adjusted updated calibration curve 1004', as illustrated in FIGS. 10(a) and (b). The measured property, in this case dI/I of the reference calibration curve 904 and the updated calibration curve 1004, is calculated at the focus of the anchor point. The difference of the measured property between points 910 and 1010 is labeled $\Delta dI/I$, and represents a performance drift which is related to focus drift as follows.

Step 1194 involves calculating and reporting measurements of performance drift, including focus drift $\Delta F$ and/or astigmatism drift $\Delta AST$. In this example implementation, to obtain the focus drift, the slope at the anchor point is calculated for the reference calibration curve 904. The focus drift ($\Delta F$) is then calculated as:

$$\Delta F = \frac{\Delta dI/I}{\text{Slope}}$$

The calculated focus drift can then be reported, if desired, for use in updating the focus control setting of the lithographic tool in future.

In an alternative implementation, the focus drift is identified more directly, using the measured properly coordinate dI/I of the anchor point 910. In that case, a point 1012 is identified where the calibration curve 1004 has the same measured value as the anchor point. The difference between the focus coordinate of this point 1012 and the stored focus coordinate of the anchor point 910 is used as a measure of focus drift $\Delta F$, as labeled. The adjusted updated calibration curve 1004' is then produced by shifting the curve 1004 left or right, in terms of the axes in FIG. 10, rather than up or down.

In experiments, the above method of measuring focus drift (after initial calibration with measurements made using the FOCAL method) has been shown to agree with updated measurements of focus made using the FOCAL method. The first implementation (adjusting up and down) has been found to slightly better in this regard than the alternative implementation.

Also in step 1194 the astigmatism drift is calculated. After the shift of the calibration curve in step 1192, the shape of the curve 1004' is still not exactly the same as the reference curve 904. This shape difference is used to measure drift in other parameters of the projection system, and astigmatism drift in particular. In one implementation, a weighted mean focus matching error between the two calibration curves 904, 1004' is calculated. The weighting factor, focus step and focus range used to calculate the focus matching error are the same as the ones used to define the mathematical model 1186, mentioned above.

Assume, for simplicity, that the mathematical model 1186 from step 1184 is a linear model of the form:

$$AST\_X\_talk = A*X + B$$

where X is the astigmatism of the FFRFEM water exposure for the new wafer and A and B are model coefficients. If there is an astigmatism drift, the exact value AST is unknown.

The definition of AST_X_talk is:

$$AST\_X\_talk = \frac{Weighted\_mean\_focus\_error}{AST\_difference}$$

Combining two equations above, we have;

$$A*X + B = \frac{Weighted\_mean\_focus\_error}{AST\_difference}$$

where AST_difference=X−X0, and X0 is the nominal astigmatism value used in step 1184. Nominal astigmatism is the one of the two or more astigmatism values which was selected as the optimal astigmatism for creating the ABF recipe, that is to say the astigmatism setting used to obtain the reference calibration curve 904.

Since A, B, X0 and Weighted_mean_focus_error are known, the equation can be solved to obtain the value of X, which is the actual astigmatism achieved when the nominal astigmatism is set. Again, experiments have shown that astigmatism drift measured in this way agrees well with astigmatism when measured independently with the FOCAL method.

Accordingly, according to some aspects of the present disclosure, there has been disclosed a method which can measure the astigmatism drift of a lithographic apparatus using the ABF method and pairs of targets printed on calibration wafers. These measurements can be obtained relatively quickly using a scatterometer, compared with the conventional FOCAL method. Embodiments of the present disclosure then include updating a setting of the lithographic apparatus for patterning future substrates.

Methods have been disclosed for improving and updating the calibration of focus measurement methods which can be applied to accurately measure, monitor and control the focus fingerprint of a lithographic apparatus. Interfield and/or intrafield focus fingerprints may be measured and reported separately, if desired. The improved focus fingerprints can be used to exploit the potential of the ABF technique for high-volume, high-density focus measurements, and so enable advanced process control and computational metrology techniques.

Other Improvements to ABF Method

Recall FIG. 8 and the principles of the astigmatism-based focus (ABF) method. In this method, pairs of target gratings TH and TV having different orientations of lines are measured using a scatterometer to obtain some difference metric, such as dI/I. When a non-zero aberration setting, such as an astigmatism offset, is applied in the printing of these targets, a relative best focus offset arises between the "horizontal" and "vertical" features. With appropriate design, the difference metric dI/I becomes monotonically dependent on focus, and can be used to measure focus performance across a substrate.

For reasons explained in the introduction, ABF has some benefits over the diffraction-based focus (DBF) method. Additionally, the ABF technique may be more robust in terms of scatterometer performance, because no asymmetric features are used. For process robustness, dual target designs may be applied, as mentioned above (different CD and/or pitch, for example).

Nevertheless, ABF is also subject to errors, under non-ideal conditions. As an example, an ABF focus measurement is sensitive to differences in printing performance between horizontal and vertical features, which could be mistaken for a difference induced deliberately by the aberration setting. These differences will be called H/V differences for short. A stable HAT difference may make the results sensitive to other performance parameters (cross terms). Depending on its cause, an H/V difference may vary over time and/or over a wafer.

Example causes of H/V performance offset can be reticle writing errors, illumination or transmission non-symmetries in the projection system. Vibrations in control of the projection system and the mask support MT and the substrate table WT give rise to blurring effects called MSD. The MSD in different directions MSDx and MSDy may be different. MSD differences will likely vary over the wafer, the others will at least be stable within a projected slit, or intrafield.

Various techniques will be disclosed to reduce the impact of RN differences in the printing of ABF metrology targets. To assist in the explanation of these various techniques, some mathematical representation of the ABF method and the principles behind it will be presented. The simpler difference metric dI will be used as an example. The same reasoning applies to the normalized difference metric, dI/I.

As seen in FIGS. 7 and 8, the ABF technique yields focus information because of the relative best focus offset dF that is induced between a pair of targets printed at the same time with the same focus error F. In an alternative method, described below with reference to FIGS. 16 and 17, this term dF comes directly from focus offsets between targets printed at different times, but the mathematical form of the Bossung curves is the same.

The simplest model of a Bossung curve is the parabola. This parabola model provides the following relationships for two Bossung curves B1 and B2 as a function of focus F.

$$B1 = c(F + \tfrac{1}{2}dF)^2$$

$$B2 = c(F - \tfrac{1}{2}dF)^2$$

$$B1 - B2 = (2cdF)F$$

$$B1 - B2 = 0 @ F = 0$$

In these relationships, c is a constant. While the Bossung curves are quadratic (parabolic) over F, the difference metric dI=B1−B2 is linear (see curve 740 in FIG. 7). The slope of the difference metric depends on the best focus offset dF, and so on the aberration setting which induces it. The condition F=0 corresponds to zero focus error in the printing of the pair of targets.

As an alternative one can consider a $4^{th}$ order model for the Bossung curves B1 and B2:

$$B1=c1(F+\tfrac{1}{2}dF)^2+c2(F+\tfrac{1}{2}dF)^4$$

$$B2=c1(F-\tfrac{1}{2}dF)^2+c2(F-\tfrac{1}{2}dF)^4$$

$$B1-B2=(2c1dF)F+4c2dFF(F^2+\tfrac{1}{4}dF^2)$$

$$B1-B2=0@F=0$$

In this case, c1 and c2 are constants. The difference metric B1−B2 in this case has a third-order (cubic) focus dependency, in other words an S-shaped calibration curve.

The above relationships are ideal, and we now consider the impact of various non-ideal conditions that arise in a real system, for reasons such as those already mentioned.

First, we consider the impact of a vertical offset in one of the Bossung curves, such as may be caused by a differential contrast effect in the projection system, or an H/V difference in the metrology tool (scatterometer). Using the simpler parabolic model, the vertical offset d is introduced in the above relationships with the following effects:

$$B1=c(F+\tfrac{1}{2}dF)^2+d.$$

$$B2=c(F-\tfrac{1}{2}dF)^2$$

$$B1-B2=(2cdF)F+d$$

$$B1-B2=0@F=-d/(2cdF)$$

Now we see that the difference metric B1−B2 has a form that is linear, but with an offset such that the focus error is no longer zero when the difference metric is zero. Moreover, the amount of focus error F at which the difference metric is zero depends on the best focus offset dF.

Second, we consider the impact of Bossung scaling, where one of the Bossung curves is magnified relative to the other. This also can be caused by H/V contrast differences in the projection system PS when printing the targets, and/or signal scaling in the scatterometer when making the measurements. A scale factor (1+γ) is applied to curve B1, with the following effects:

$$B1=(1+\gamma)c(F+\tfrac{1}{2}dF)^2$$

$$B2=c(F-\tfrac{1}{2}dF)^2$$

$$B1-B2=(2cdF)F+\gamma c(F+\tfrac{1}{2}dF)^2$$

$$B1-B2=@F=-\tfrac{1}{2}\gamma(F+\tfrac{1}{2}dF)^2/dF$$

The second term in the difference metric B1−B2 indicates an offset in the difference metric that is itself Bossung shaped. Again, the amount of focus error F at which the difference metric is zero depends on the best focus offset dF.

Third, we consider the impact of Bossung asymmetry, in which there is a difference between the left and right flanks of the Bossung curves. Such an effect can be caused, for example, by non-symmetric imaging in the projection system. It can also be caused (or appear to be caused) by asymmetry in the response of the inspection apparatus such as a scatterometer. For the purposes of focus measurement, asymmetry in the scatterometer response will only be significant in cases where different scatterometers with different asymmetric responses are used to make focus measurements. The relationships expressed with an additional parameter dc are as follows:

$$B1=(c+\tfrac{1}{2}dc)(F+\tfrac{1}{2}dF)^2$$

$$B2=(c-\tfrac{1}{2}dc)(F-\tfrac{1}{2}dF)^1$$

$$B1-B2=(2cdF)F+dc(F+\tfrac{1}{2}dF)^2$$

$$B1-B2=0@F=-dc(F+\tfrac{1}{2}dF)^2/(2cdF)$$

The impact is effectively similar to the previous case (Bossung scaling). The second term in the difference metric B1−B2 indicates an offset in the difference metric that is itself Bossung shaped. Again, the amount of focus error F at which the difference metric is zero depends on the best focus offset dF.

A fourth case is the impact of Bossung tilt, related to Zernike coefficient Z9, which can also be considered as an asymmetric best focus offset. The relationships expressed with an additional parameter e are as follows:

$$B1=c(F+\tfrac{1}{2}dF)^2+e(F+\tfrac{1}{2}dF)$$

$$B2=c(F-\tfrac{1}{2}dF)^2+e(F-\tfrac{1}{2}dF)$$

$$B1-B2=(2cdF)F+e\,dF$$

$$B1-B2=0\ @F=-e/(2c)$$

In this case we see an offset in the different metric B1−B2 which is dependent on the relative best focus offset dF. However, the defocus value at which the difference metric is zero (−e/2c) is independent of dF.

Having identified the above four cases, a range of other effects can be explained in first order as an equivalent of the ones above. For example, a local Bossung shape is locally like a Bossung offset.

Figure 12A:
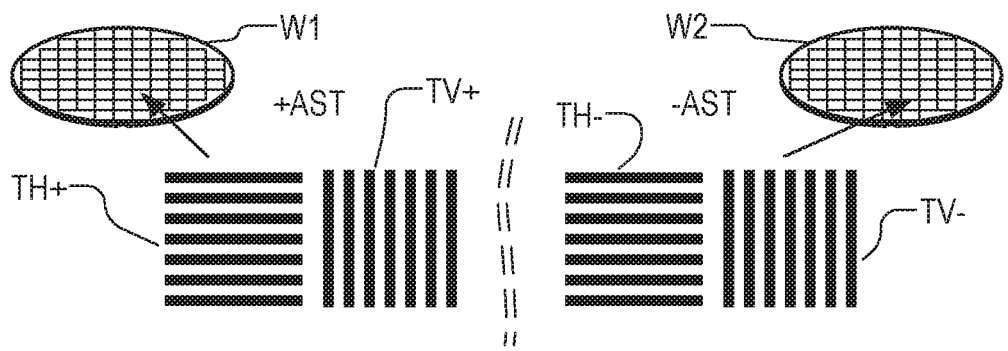
FIGS. 12(a)-12(b) illustrate the formation of additional target pairs for use in an improved version of the ABF method having positive and negative aberration settings in an embodiment of the third aspect of the invention, 12(a) using two substrates and 12(b) using two exposures on a single substrate.
Figure 12B:
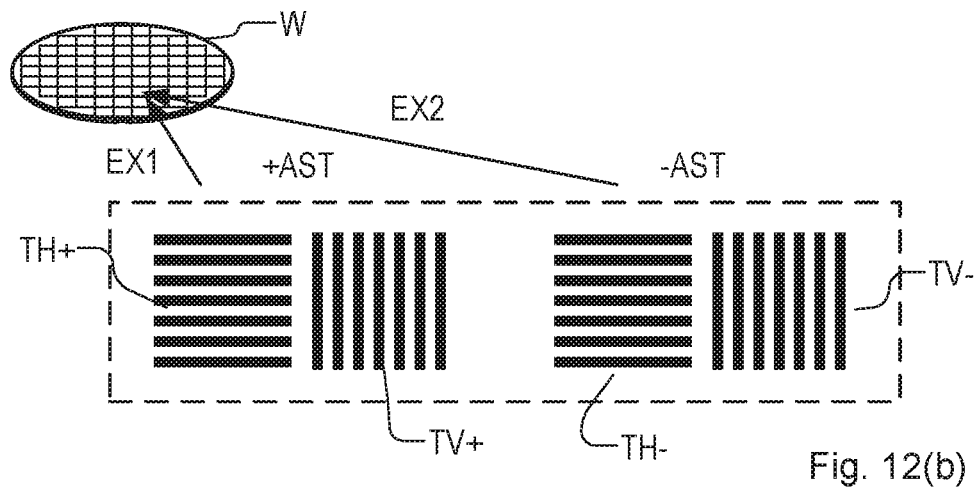

Referring now to FIG. 12, it is proposed to improve the robustness of ABF measurements against aberration drift and the other effects identified above, by combining measurements from pairs of targets that have been printed with opposite values of aberration settings (astigmatism, for example).

FIG. 12 (*a*) shows two substrates W1, W2, each of which has been printed with pairs of horizontal and vertical gratings for use as targets in focus metrology by the ABF method. On the first substrate W1 a first target TH+ and a second target TV+ have been printed using a first aberration setting that induces a relative best focus offset between the targets. The label +AST indicates this first setting, which is for example a positive astigmatism setting. On the second substrate W1 a second target TH− and a second target TV− have been printed using a second aberration setting that induces a relative best focus offset between the targets. The label −AST indicates this second setting, which is for example a negative astigmatism setting.

FIG. 12(*b*) shows another implementation in which the two pairs of targets TH+, TV+ and TH−. TV− are printed side-by-side on a single substrate W. The first pair of targets TH+, TV+ are printed using a first exposure step EX1 and then the second pair of targets TH−, TV− are printed using a second exposure EX2 in the same resist layer. A small positional offset is applied between the two exposures, so that the targets appear side-by-side in the resist, and not overlaid. Only after both exposures is the substrate removed from the lithographic apparatus and the pattern in the resist material is developed and measured with the scatterometer.

This method has the advantage of speed and uses fewer substrates than the example of FIG. 12(a), and ensures that the performance of the projection system is as unchanged as possible between the pairs of targets. Otherwise, the two implementations are equivalent.

It is proposed that the positive and negative aberration settings +AST and −AST are equal in magnitude and opposite in sign. In that case, assuming that the aberration setting works as intended, the relative best focus offset dF will also be equal and opposite in sign. Then, when deriving a focus measurement, the difference metrics dI or dI/I obtained from the two pairs of targets can be combined, for example by a simple average. Because the relative best focus offset is equal and opposite, certain of the error terms caused by the effects discussed above will be cancelled out, and the combined measurement will be robust against these errors.

For example, we recall from the fourth effect considered above, the difference metric has an offset term (e dF). If two measurements are combined with opposite offsets terms, source of error in the focus measurement is eliminated. In other words, combining measurements from targets printed with both positive and negative aberration settings will make the method robust against the effects of Bossung tilt (spherical aberration, Z9). In the case of the second and third scenarios, the offset term is not simply proportional to dF, but still by making measurements with positive and negative dF, the effects are likely to be reduced.

While equal and opposite aberration settings are favored, some benefit may be obtained by choosing aberration settings that are at least different in sign, if not equal in magnitude. A difference in sign will in most implementations involve a positive and a negative sign, but in principle one of the aberration settings could be zero and the other one either positive or negative.

In addition to improving robustness against the effects described above, combining measurements from targets printed with both positive and negative aberration settings can mitigate the effect of drift in the aberration performance of the ABF method. As already described with reference to FIGS. 9-11 above, a real lithographic apparatus may suffer from a drift in performance, such that the actual aberration (astigmatism) obtained using a given aberration setting is no longer what it was originally.

Suppose for example that an astigmatism setting of 100 nm has been chosen as part of the recipe for printing and measuring ABF targets. If the astigmatism of the projection system PS in a given lithographic apparatus drifts from zero to, say, 5 nm, then a non-zero setting AST=100 nm will cause an astigmatism of 105 nm, when 100 nm was intended. This change in the astigmatism will change the dF of targets printed. Measurement of focus using calibration information obtained before the drift occurred will no longer be accurate.

Now if we print targets with both positive and negative settings, namely AST=+100 nm and AST=−100 nm, then as one target pair (TH+, TV+) is printed with an astigmatism of 105 nm, the other target pair (TH−, TV−) is printed with astigmatism of −95 nm instead of −100 nm. This means that the effect of the 5 nm drift in performance is substantially opposite when the two target pairs are measured. Averaging the difference metrics from the opposite settings brings us back substantially to the desired result.

Using dI/I as the difference metric, the above is summarized as follows. With a single pair of targets, the measurement is based on the value:

$$dI/I = (H-V)/(H+V)$$

where each letter H stands for the intensity of a certain diffraction signal obtained from the target TH and so forth etc. Applying the positive and negative aberration settings, we can combine intensities H+ and H− etc. from the different targets to obtain an average difference metric as follows:

$$(dI/I)_{AVE} = \{(H_+ - V_+)/(H_+ + V_+)\} - \{(H_- - V_-)/(H_- + V_-)\}$$

where $H_+$ is the intensity from the target TH+, and so forth. The average difference metric is calculated by subtraction of the two individual dI/I metrics, because we are interested in the average magnitude as a measure of focus and the difference metrics for the two pairs will have opposite signs.

The above is not the only expression that can be used, however. The measurements from the positive and negative targets can be combined before the difference metric is calculated, instead of after. So, it might be found that an equivalent expression such as:

$$(dI/I)_{AVE} = \{(H_+ - H_-)/(H_+ + H_-)\} - \{(V_- - V_-)/(V_+ + V_-)\}$$

might be used instead.

The above method provides a measurement method that is robust against astigmatism drift, but does not in itself provide a measure of astigmatism drift. If a measurement of astigmatism drift is wanted, the method of FIGS. 9 to 11 can be used. Additional or alternative methods can be applied, if desired, including a method that will described further below.

Additional pairs of targets can be printed under further different conditions and their measurements combined with those described above, to improve further the robustness of the overall method. It is a matter for the implementer whether the additional printing and measuring overhead is justified by the additional accuracy and/or additional diagnostic information that may be obtained). For example, H/V differences due to effects other than the desired ABF method can be removed by printing additional target pairs under different settings such as, for example, pole imbalance in the illumination profile, or introducing an X/Y contrast difference in the scanning operation (scan skew or scan scaling can be introduced). H/V differences in the scatterometer can be captured and corrected by measuring the same targets more than once, under different rotations.

Some of these effects will be quite static, so that additional exposures and measurements are needed only to refine the calibration information, and not every time a measurement is made, and perhaps not with every time the basic calibration is updated. Other times, it may be desired to print multiple pairs of targets every time.

Figure 13:
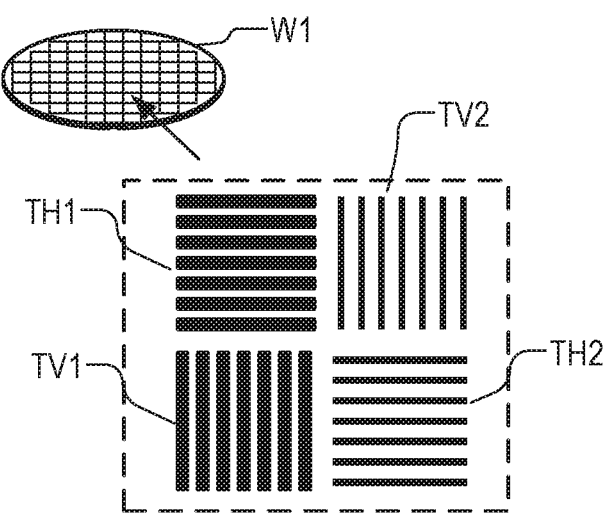
FIG. 13 illustrates an additional improvement that may be applied in the methods according to the aspects of the present invention.

FIG. 13 shows another target design which includes more than one pair of targets. A first pair of targets comprise horizontal grating TH1 and vertical grating TV1. A second pair of targets comprise horizontal grating TH2 and vertical grating TV2. The gratings of the first pair of targets have a first line-space width while the gratings of the second pair have a second line-space width ratio. In general, additional robustness can be obtained by printing and measuring pairs of targets with different pitches and/or linewidths.

In the particular example illustrated, the pitch is the same in both pairs. For example, the pitch might be 600 nm or it might be 450 nm. The pitch is comparable to the wavelength of the measuring radiation. In the first pair of gratings TH1 and TV1, the lines are broader than the spaces, while the second pair of gratings have spaces wider than lines. In a simple example, the first line-space width ratio is a reciprocal of the second line-space width ratio. For example, the CD/pitch parameter of the first pair of targets might be 450/600 while that of the second pair of targets might be 150/600.

This arrangement of "line" gratings and "space" gratings is suitable for addressing a problem that the ABF measurements can be sensitive to local MSDx vs MSDy differences. MSD which stands for "mean standard deviation" is effectively a blurring effect caused by dynamic positioning errors (servo errors, vibrations etc.) in the various positioning subsystems of the lithographic apparatus. These MSD effects can be very different for horizontal and vertical features, and so could be mistaken for the effect of astigmatism in the ABF method. Additionally, however, the MSD effects will have opposite effects in the case of line and space targets of the type shown in FIG. 13. Using dI measurements from pair of line targets and the pair of space targets illustrated in FIG. 13, these MSDx vs MSDy errors can be (largely) removed by subtracting the dI metrics into one measurement. This will increase (but by far not double) the measurement time. If the measurements of the different targets can be done simultaneously, using for example dark-field imaging modes of the inspection apparatus shown in FIG. 3, then the measurement time need not be increased at all.

The techniques of FIGS. 12 and 13 can be combined, using four pairs of targets. Combining measurements between line targets and space targets allows focus measurements less sensitive to MSDx vs MSDy variations. Combining measurements from targets printed with positive and negative aberration settings allows the measurements to be more robust for Z9 and other cross terms, as well as for drift of the astigmatism.

Writing expressions for combining intensities from four target pairs TH1+/TV1+, TH1−/TV1−, TH2+/TV2+, TH2−/TV2− in the notation established above, we can express the calculation of an average dI/I metric as:

$$(dI/I)_{AVE} = [\{(H_{1+} - V_{1+})/(H_{1+} + V_{1+})\} - \{(H_{1-} - V_{1-})/(H_{1-} + V_{1-})\}] - [\{(H_{2+} - V_{2+})/(H_{2+} + V_{2+})\} - \{(H_{2-} - V_{2-})/(H_{2-} + V_{2-})\}]$$

As mentioned above, the individual intensities can be combined in different sequences with the same effective result, and the above is just one way of performing the combination of measured intensity values. The above expressions show normalization being applied to obtain dI/I as a difference metric, and not merely dI. Note that one would not normally apply normalization across different target designs (i.e. one would not use $(H_{1-} + H_{2-})$ as a normalizing denominator for $dI = (H_{1-} - H_{2-})$.

Figure 14:
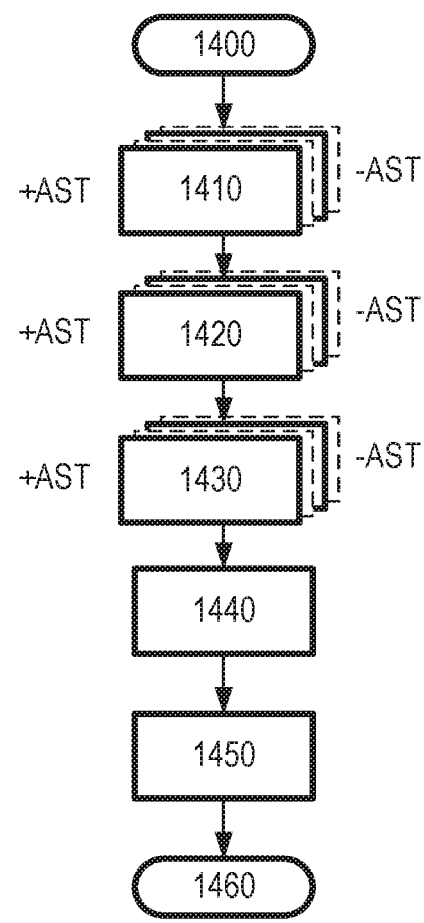
FIG. 14 is a flowchart of a method implementing focus measurement in an embodiment of the third aspect of the invention.

FIG. 14 is a flowchart of the steps of a method for monitoring a focus parameter during a lithographic process according to an exemplary embodiment of the techniques just described with reference to FIGS. 12 and 13. The steps are as follows, and are then described in greater detail thereafter:

1400—Start.

1410—Print at least a first pair of (H/V) targets with a positive aberration setting and print at least a second pair of targets with a negative aberration setting to print at least two pairs of targets as illustrated in FIG. 12(a) or (b). Optionally print two or more pairs of targets, for example to include both "line" targets and "space" targets, as described with reference to FIG. 13;

1420—Perform measurements by inspection of the first targets of each pair of targets (e.g. the horizontal gratings) to obtain first measurement values;

1430—Perform measurements by inspection of the second targets of second pair of targets (e.g. the vertical gratings) to obtain second measurement values;

1440—Calculate focus by combining difference from the first and second pairs of targets to obtain a combined difference metric and then using calibration information;

1450—Use calculated focus measurement in focus setting for subsequent exposures.

1460—End.

At step 1410, a first pair of targets is printed with a positive aberration setting and a second pair of targets is printed with a negative aberration setting, to print at least two pairs of targets as illustrated in FIG. 12(a) or (b). Optionally print two or more pairs of targets, for example to include both "line" targets and "space" targets, as described with reference to FIG. 13.

In step 1420, each measurement may be of the intensity (or related parameter) of one of the diffraction orders of radiation scattered by the relevant target. This first measurement may be obtained using any of the scatterometer devices described herein, for example. It is also contemplated within the scope of this disclosure that the first measurement be a CD measurement (whether obtained using a scatterometer, scanning electron microscope or other suitable device) or any other measurement of a parameter which has a Bossung curve relationship with focus.

In step 1430, each second measurement should be performed using the same method as the first measurement. Where the first measurement is of the intensity (or related parameter) of one of the diffraction orders of radiation scattered by the first target, the second measurement should be of the same diffraction order of radiation scattered by the second target of the same pair. The diffraction order may be either of the first diffraction orders or the zeroth diffraction order. However, higher diffraction orders can also be used and are within the scope of the disclosure. Further measurements may be made if there are more than two pairs targets printed. These additional targets may each comprise best focus offsets that are different to that of said first target and/or said second target.

For simplicity for the purposes of the present example, it may be envisaged that the steps 1420 are 1430 are performed sequentially, using the pupil image sensor 19 of the scatterometer of FIG. 5 to acquire diffraction pupil images like those shown in FIG. 8. In other embodiments, however, step 1420 and step 1430 may be performed as a single step such that the first measurement value and second measurement value are obtained in a single acquisition. In addition, where there are more than two pairs of targets being measured, targets from two or more pairs may be measured in a single acquisition to obtain a corresponding number of measurement values.

In a specific example, a measurement device, such as that illustrated in FIG. 5, can be used to measure a composite target comprising multiple individual targets (individual periodic structures or gratings) using the imaging optical system 22 and sensor 23. The layout of the composite target may look like that of FIG. 13, for example. The gratings of the composite target may be positioned closely together so that they will all be within an image field or measurement spot formed by the illumination beam of the metrology apparatus. In this way, the gratings can be all simultaneously illuminated and simultaneously imaged on the imaging branch detector 23. These images can then be processed to identify the separate images of the gratings, and extract diffraction signals for each grating from these images.

At step 1440, the focus error affecting each target pair is calculated from the combination of all the measurement values, rather than from a single pair. This calculation can be performed using the combined dI/I metric, as described above. A stored calibration curve is used to translate the dI metric into a focus error measurement. Where more than one pair of targets is measured, and/or more than one diffraction order for each pair of targets, these can be combined to improve accuracy. In one implementation, the signals from different AST settings and pairs of targets are combined to create a single calibration curve for deriving focus from the combined difference metric. Other implementations may be used, if desired.

At step 1450, the calculated focus can then be used in focus parameter monitoring during subsequent lithographic processes, so as to maintain focus accuracy and consistency during exposure.

It will be understood that the above steps are typically applied in parallel to numerous targets distributed across a field and across a substrate, to measure a focus "fingerprint" of the lithographic apparatus.

Alongside the steps 1400-1450, there will be provided a method of calibrating the focus measurement method. This may include for example the FOCAL and ILIAS methods, mentioned above. The calibration methods of FIGS. 9 to 11 may be applied, or other methods.

Figure 15A:
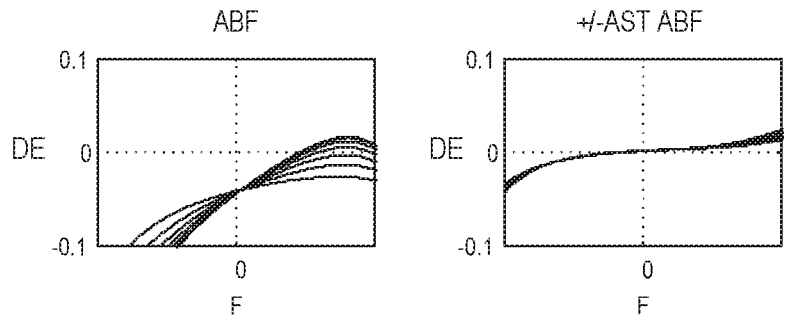
FIGS. 15(a)-15(c) illustrates the improved accuracy of a method embodying the third aspect of the invention.
Figure 15B:
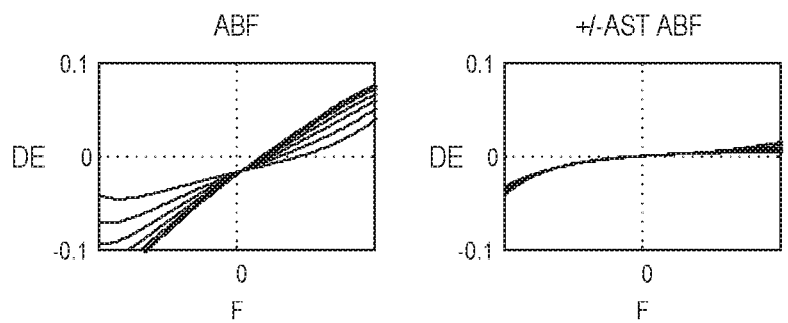
Figure 15C:
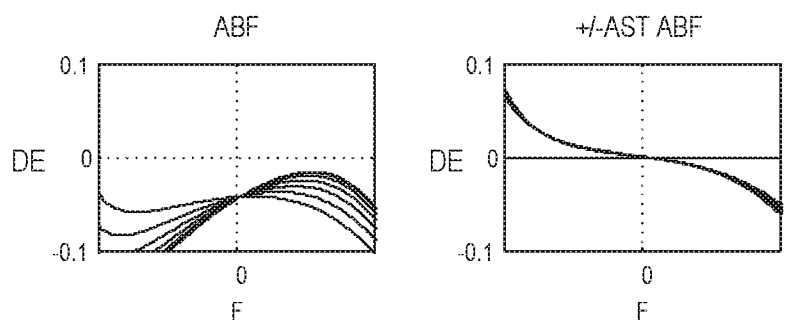

FIG. 15 demonstrates the improvement in accuracy obtained by using positive and negative aberration settings in a simulation of the proposed method. In each part, (a), (b), (c) the graph on the left shows a measure of error DE in the dI/I metric under a range of conditions and aberration settings, when non-ideal effects are introduced of the type described above, and relative to the dI metric obtained without those non-ideal effects. The offset of the difference metric is clearly seen in the non-zero values of DE at zero focus error. Also, the variation of the shapes of the curves for different aberration settings indicates sensitivity to the best focus offset dF. The graphs on the right show the results when pairs of targets with positive and negative aberrations settings are printed, and measurements of those pairs of targets are combined. Both the offset at F=0 and the sensitivity to dF are virtually eliminated.

Focus Metrology Using Focus Offsets and Multiple Exposure

Another aspect of the disclosure concerns a technique that may be applied as an alternative to Astigmatism Based Focus metrology (ABF). As described above, ABF relies on differences in the printing of a pair of targets whose features have different orientations (H and V for short), which can be measured by observing differences in their diffraction signals. When these are measured in the scatterometer, the diffraction signals from the two targets of a pair actually travel through the scatterometer optics along quite different paths. This causes a signal difference that may vary between individual scatterometers. If this happens, then the ABF focus calibration will vary between individual scatterometers. It is highly desirable to have a single calibration for all scatterometers. To address this, some pairs of targets are currently measured twice, with a relative 90-degree wafer rotation. Both measurements are combined, to cancel out the differences between H and V response of the scatterometer optics. The need for additional measurements and the wafer rotation step adds undesirably to the focus metrology overhead, although it does not need to be done for every pair, only a few sample pairs.

Figure 16A:
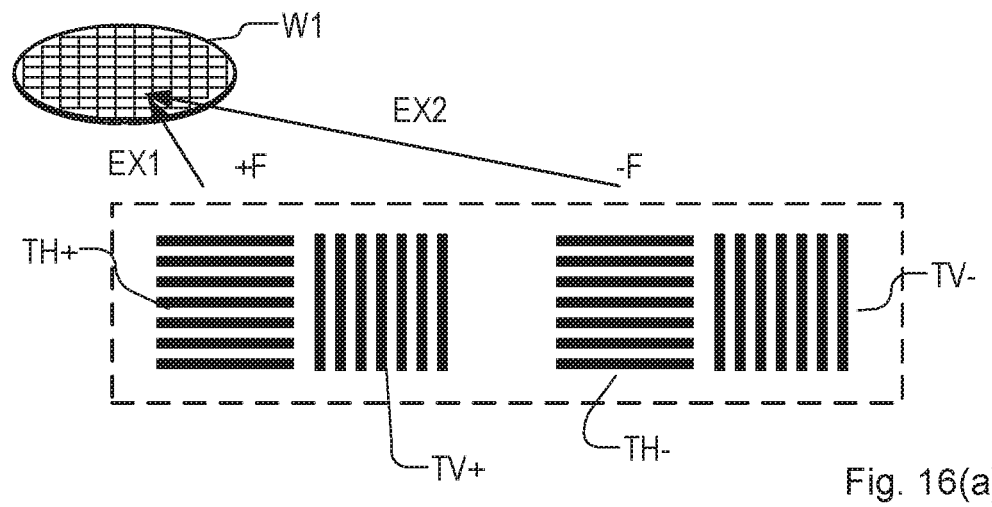
FIGS. 16(a)-16(b) illustrates the formation of target pairs formed in two exposures on a single substrate, implementing a focus measurement method and or an aberration measurement method according to the fourth and/or fifth aspects of the invention, 16(a) using two pairs of targets and 16(b) using four pairs of targets.

FIG. 16(a) illustrates the principles of the alternative method, which is based on multiple focus offsets and a multiple exposure technique. A lines and spaces pattern is printed twice in the same resist (dual exposure). In this example, the pattern defines a horizontal grating TH and a vertical grating TV, as in the ABF technique. In this embodiment, two pairs of targets TH+, TV+ and TH−, TV− are printed side-by-side on a single substrate W. The first pair of targets TH+, TV+ are printed using a first exposure step EX1 and then the second pair of targets TH−, TV− are printed using a second exposure EX2 in the same resist layer. The method does not require any aberration setting such as astigmatism to be applied. The method does not require any best focus offset to be induced between the targets of a pair (although that is not excluded). The method does not in principle require pairs of targets at all, per exposure, but the provision of separate H and V gratings provides additional benefits, as described below.

Instead of an aberration setting, a first focus offset, for example a positive focus error +F, is applied when printing the pattern in exposure EX1 to form the first pair of targets TH+, TV+. A second focus offset, for example a negative focus offset F−, is applied when printing the pattern in exposure EX2 to form the second pair of targets TH−, TV−. A small positional offset is applied between the two exposures, so that the targets appear side-by-side in the resist, and not overlaid. Only after both exposures, is the substrate removed from the lithographic apparatus and the pattern in the resist material is developed. The targets produced in this way can be measured individually using a scatterometer, using methods similar to those described above.

As mentioned, the two exposures differ by a programmed focus offset. This focus offset can be realized directly by injecting a certain defocus when controlling the lithographic apparatus. Injecting a defocus will typically result in the substrate being positions slightly higher or lower than for best focus. The focus offset can also be induced in other ways, if desired, including by astigmatism. In the case of a projection system based on refractive optics the focus offset can be induced by modifying the central wavelength of radiation source SO (FIG. 1)), so that the projection system focuses the pattern at a slightly different position. The optimal choice of method depends on the accuracy and repeatability of the focus impact of each method. Any suitable combination of focus offsets can be used but equal and opposite focus offsets F± and F− are a good choice.

The magnitude of the focus offsets should be large enough to ensure that local variations of focus, plus any anticipated focus drift, are not enough to tip the resulting focus error over the top of the Bossung curve. In an example process, focus offsets of +/−50 nm are chosen. In another example, however, the focus offsets might be 100 nm and 200 nm, both positive or both negative. By moving the central point of the focus offsets, one can effectively choose the focus value where the difference metric is zero, and so minimize cross-talk with other parameters of the process.

Between the two exposures, any automated focus or other imaging corrections are disabled, so that the focus offset between the two exposures is fully determined by a recipe used for exposing the focus metrology targets. The calibration curve is however sensitive to short term focus dynamics, related to the difference in exposure time of the exposures EX1 and EX2.

The magnitude of the focus offset per target is a matter to be defined in a metrology recipe, but it may be for example about half of the astigmatism offset applied in the current ABF technique.

The scatterometer is used to measure certain diffraction signals, for example the first order diffraction signals, when each target is illuminated with a spot of radiation. From the difference and average of these diffraction signals over a calibration wafer (for example FFRFEM wafer as described above), a focus calibration curve is constructed, in a manner similar to that described above. This allows inference of focus error in targets printed in future.

In contrast to the ABF method, the difference metric dI or dI/I is not taken between a pair of gratings comprising one horizontal grating and one vertical grating. Rather the difference metric is between two targets which originate from the same reticle pattern, and differs only in the focus offset applied. Thus, for example, a difference between grating TH+ and TH− is taken. Even if H and V gratings are printed, this is merely to give additional measurements. Using as the difference metric, and using similar notation to that used above, the calculation of the difference metric for measurement of the four targets in FIG. 16(a) is summarized as follows:

$$(dI/I)_{AVE} = \{(H_+ - H_-)/(H_+ + H_-)\} + \{(V_+ - V_-)/(V_+ + V_-)\}$$

where the subscripts '+' and '−' indicate the first and second focus offsets, not aberration settings. Thus $H_+$ represents the intensity from the target TH+, and so forth. The average difference metric is calculated by addition of the two individual dI/I metrics, because they will have the same sign, and we are interested in the average of the difference metric for the two pairs of targets.

Because the targets within each pair are printed from the same pattern on a reticle and are measured through the substantially the same path in the scatterometer, the calibration of the above difference metric is insensitive to many sources of error that can affect the ABF method. For example, it is insensitive to reticle writing errors, to imperfections of the scatterometer optics, to astigmatism. The same calibration curve can even be used across different mask technologies and lithographic apparatuses. Because of the need for non-zero focus offsets, the method is not likely to be suitable for measurement on product wafers, but it can be useful suitable for monitoring wafers, and send-ahead wafers.

As mentioned, by providing two pairs of targets with H and V orientation, additional information can be extracted, especially information relating to astigmatism performance. Recalling the calculation of a difference metric for focus:

$$F \sim (dI/I)_{AVE} = \{(H_+ - H_-)/(H_+ + H_-)\} + \{(V_+ - V_-)/(V_+ + V_-)\},$$

the same four diffraction signals can be used to obtain a measurement of astigmatism by combining them in a different way:

$$AST \sim \{(H_+ - H_-)/(H_+ + H_-)\} - \{(V_+ - V_-)/(V_+ + V_-)\},$$

by changing from addition of the two terms to subtraction of the same two terms. Therefore, although the method of FIG. 16 requires two exposures with different focus offsets, compared with the known ABF method with only one exposure, it has the added benefit of providing relatively direct measurement of astigmatism. It should be appreciated that the focus and astigmatism measurements by this method are for identifying variations of focus and astigmatism across a substrate (interfield fingerprint) and/or across a field (intrafield fingerprint). Measurements of absolute values for focus and astigmatism can be made, when required, using other techniques such as those described above and in the prior art.

Figure 16B:
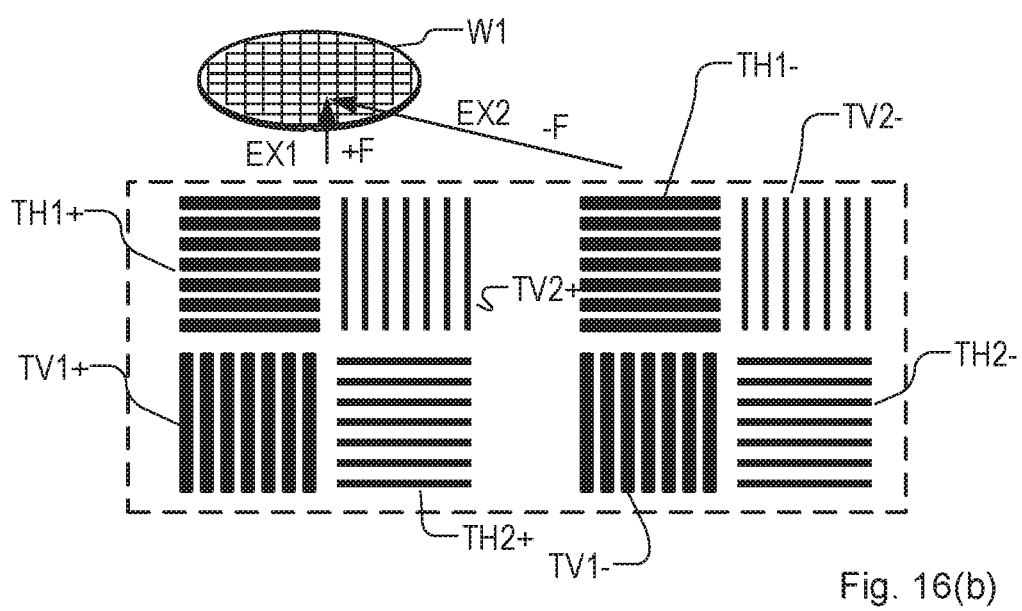

As shown in FIG. 16(b), the principle can be expanded to more than one or two pairs of targets. A target layout with four pairs of targets is shown, in which targets with different design parameters are printed in each exposure EX1, EX2, As in FIG. 13, eight targets in all are printed, and labeled TH1+, TV1+, TH1−, TV1−, TH2+, TV2+, TH2−, TV2−. The letter 'H' or 'V' in each label indicates horizontal or vertical orientation of the grating lines. Suffix ' 1' or '2' indicates the first or second design parameters, for example different CD and/or pitch. The suffix '+' or '−' in the label indicates which exposure, and consequently which focus offset, was applied in the printing of that grating. Expanding the above equation to calculate an average dI/I metric from diffraction signals of all eight targets, we can write:

$$(dI/I)_{AVE} = [\{(H_{1+} - H_{1-})/(H_{1+} + H_{1-})\} + \{(V_{1+} - V_{1-})/(V_{1+} + V_{1-})\}] + [\{(H_{2+} - H_{2-})/(H_{2+} + H_{2-})\} + \{(V_{2+} - V_{2-})/(V_{2+} + V_{2-})\}].$$

which is effectively an average of (i) an average difference metric for the "design 1" targets and (ii) an average difference metric for the "design 2" targets.

Additionally, an enhanced measurement of astigmatism can be obtained using all eight targets with a formula expanded to:

$$AST \sim [\{(H_{1+} - H_{1-})/(H_{1+} + H_{1-})\} - \{(V_{1+} - V_{1-})/(V_{1+} + V_{1-})\}] + [\{(H_{2+} - H_{2-})/(H_{2+} + H_{2-})\} - \{(V_{2+} - V_{2-})/(V_{2+} + V_{2-})\}]$$

As in the example of FIGS. 12 to 14, the above calculation is only one way of combining the eight values. Instead of combining the difference metrics separately for the "design 1" and "design 2" targets, they could be combined separately for the H and V targets, for example, and then combined into a final result. As mentioned above, normalization dividing by the average signal from two targets of different designs will not normally be appropriate.

Figure 17:
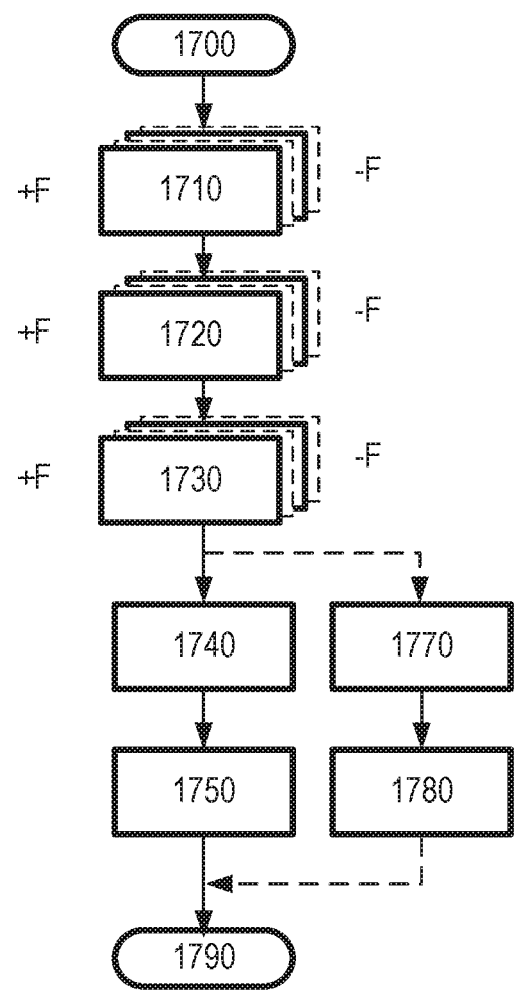
FIG. 17 is a flowchart of a method implementing focus measurement and aberration measurement method in an embodiment of the fourth and fifth aspects of the invention.

FIG. 17 is a flowchart of the steps of a method for monitoring a focus parameter during a lithographic process according to an exemplary embodiment of the techniques just described with reference to FIGS. 16(a) and (b). The steps are as follows, and are then described in greater detail thereafter:

1700—Start.

1710—Print at least a first pair of targets by a sequence of two exposures in the same resist, using different focus offsets in the two exposures, for example a positive focus offset F+ and an equal and opposite negative focus offset F−; optionally print two or more targets in each exposure;

1720—Perform measurements by inspection of the first targets of each pair of targets (e.g. the F+ targets) to obtain first measurement values;

1730—Perform measurements by inspection of the second targets of second pair of targets (e.g. the F− targets) to obtain second measurement values;

1740—Calculate a measurement of focus by combining diffraction signals from a first target and a second target of a pair of targets to obtain a difference metric and then using calibration information; optionally combine diffraction signals from two or more pairs of targets to obtain a combined difference metric and/or or multiple difference metrics;

1750—Use the calculated focus measurement in focus setting for subsequent exposures.

1770—Calculate a measurement of astigmatism by combining diffraction signals from a first target and a second target of a pair of targets to obtain a difference metric and then using calibration information; optionally combine diffraction signals from two or more pairs of targets to obtain a combined difference metric and/or or multiple difference metrics so that the measure of astigmatism is more robust;

1780—Use the calculated astigmatism measurement in calibration and/or astigmatism setting for subsequent exposures.

1790—End.

At step 1710, a first target is printed with a positive focus offset setting and a second target is printed with a negative focus offset, to form a pair of targets for focus metrology. The targets are printed in the same resist layer with a positional offset inserted between the exposures, so that they are not overlaid. Optionally, two or more pairs of targets are printed, for example to include both "horizontal" targets and "vertical" gratings, as illustrated in FIG. 16 (*a*) and/or targets with different design parameters, as illustrated in FIG. 16(*b*).

In step 1720, each measurement may be of the intensity (or related parameter) of one of the diffraction orders of radiation scattered by the relevant target. This first measurement may be obtained using any of the scatterometer devices described herein, for example.

In step 1730, each second measurement should be performed using the same method as the first measurement. Where the first measurement is of the intensity (or related parameter) of one of the diffraction orders of radiation scattered by the first target, the second measurement should be of the same diffraction order of radiation scattered by the second target of the same pair. The diffraction order may be either of the first diffraction orders or the zeroth diffraction order. However, higher diffraction orders can also be used and are within the scope of the disclosure. Further measurements may be made if there are more than two pairs targets printed. These additional targets may each comprise best focus offsets that are different to that of said first target and/or said second target.

For simplicity for the purposes of the present example, it may be envisaged that the steps 1720 are 1730 are performed sequentially, using the pupil image sensor 19 of the scatterometer of FIG. 5 to acquire diffraction pupil images like those shown in FIG. 8. In other embodiments, however, step 1720 and step 1730 may be performed as a single step such that the first measurement value and second measurement value are obtained in a single acquisition. In addition, where there are more than two pairs of targets being measured, targets from two or more pairs may be measured in a single acquisition to obtain a corresponding number of measurement values.

In a specific example, a measurement device, such as that illustrated in FIG. 5, can be used to measure a composite target comprising multiple individual targets (individual periodic structures or gratings) using the imaging optical system 22 and sensor 23. The layout of the composite target may look like that of FIG. 13, for example. The gratings of the composite target may be positioned closely together so that they will all be within an image field or measurement spot formed by the illumination beam of the metrology apparatus. In this way, the gratings can be all simultaneously illuminated and simultaneously imaged on the imaging branch detector 23. These images can then be processed to identify the separate images of the gratings, and extract diffraction signals for each grating from these images.

At step 1740, the focus error affecting the substrate can be calculated from the measurements of a single pair of targets (one F+, one F−) or, optionally, from a combination of all the measurement values on two or more target pairs. This calculation can be performed using the combined dI/I metrics, as described above. A stored calibration curve is used to translate the dI/I or other difference metric into a focus error measurement. Where more than one pair of targets is measured, and/or more than one diffraction order for each pair of targets, these can be combined to improve accuracy. A calibration curve can be created for each CD/pitch combination, or a single calibration curve can be created for all CD-pitch combinations.

At step 1750, the calculated focus can then be used in focus parameter monitoring during subsequent lithographic processes, so as to maintain focus accuracy and consistency during exposure.

At step 1770, the astigmatism affecting the substrate can be calculated from the measurements of two pairs of targets (combinations of F+ and F−, H and V) or, optionally, from a combination of all the measurement values on more than two target pairs. This calculation can be performed using the combined dI/I metrics, as described above. A stored calibration curve is used to translate the difference metric into an astigmatism measurement, which can be compared with an astigmatism setting used at the time of the exposures. Where more than two pairs of targets is measured, and/or more than one diffraction order for each pair of targets, these can be combined to improve accuracy. Again, a calibration curve can be created for each type of target pairs, or a single calibration curve can be created for all target pairs.

At step 1780, the calculated astigmatism can then be reported and used to apply corrections during subsequent lithographic processes, and/or to trigger maintenance actions if necessary so as to maintain optimum printing performance during exposure of product wafers.

It will be understood that the above steps are typically applied in parallel to numerous targets distributed across a field and across a substrate, to measure a focus "fingerprint" of the lithographic apparatus.

Alongside the steps 1700-1790, there will be provided a method of calibrating the focus measurement method. This may include for example the FOCAL and ILIAS methods, mentioned above. The calibration methods of FIGS. 9 to 11 may be applied, or other methods.

In conclusion, the example of FIGS. 16 and 17 allows measurement of focus performance and/or aberration performance without the drawbacks of the ABF method. In cases where it is still preferred to use the ABF method to measure focus, the technique illustrated in FIG. 16 can be used additionally, as an alternative measure of astigmatism to the one described in FIGS. 9 to 11. In other words, the steps 1740 and 1750 can be omitted, if astigmatism is the only parameter of interest, and the steps 1770 and 1780 can be omitted if focus is the only parameter of interest.

Alternative and additional methods for measuring imaging conditions for correction and/or calibration accuracy improvement In the ABF method, and also other methods such as diffraction based focus DBF, measurement results and consistency are impacted by imaging artifacts of the litho tool. As described above, periodic tests using a more accurate form of metrology, such as FOCAL tests, can be used to measure intrafield fingerprint. FOCAL can also be used to measure the mean focus, and astigmatism drift.

However, FOCAL tests can take a lot of time on the litho tool, at the cost of productivity of these very expensive tools. Additionally, it is found that the intrafield fingerprint of focus and/or astigmatism obtained by ABF can be different from the fingerprint obtained with the reference FOCAL metrology. Then, when an aberration (AST offset) is applied to perform the ABF measurement, it introduces an intrafield aberration fingerprint different to the one measured in FOCAL metrology, which potentially affects the intrafield focus fingerprint obtained with ABF focus metrology. Other calibration techniques used, for example to obtain intrafield focus fingerprints in EUV litho tools, also demand significant time on the litho tool itself The calibration curves upon which the ABF and other methods depend can be influenced by drifting illumination conditions, such as dose and astigmatism. In the alternative technique of DBF, the interfield fingerprint sometimes includes spurious fingerprints that can be attributed to (apparent) dose effects.

In this section, a new method is introduced which can measure any or all of mean focus, dose, astigmatism, focus interfield and intrafield fingerprints with scatterometry. All measurements can be performed outside the litho tool using metrology system MET. The method can be applied in support of focus monitoring by ABF or other methods, as described in the previous sections. The method can be applied completely independently, as desired.

A patterning device (reticle) defines line-space targets which, when printed, can have their scattering (diffraction) properties measured by scatterometry in an apparatus of the type described in the examples above. As in the examples above, calibration targets are defined which comprise line-space grating structures, the targets being arranged in pairs comprising line-space grating structures with different orientations. As in the methods above, patterns defining the targets of said pairs of targets do not comprise features which introduce focus dependent asymmetry in the absence of an aberration such as astigmatism.

In some embodiments, the method uses an FEM wafer or wafer in which numerous identical target patterns are printed with different, known values of focus error and dose error. This type of wafer is well-known and called an FEM (focus-exposure matrix) wafer, described for example in patent U.S. Pat. No. 5,856,052 (Leroux), mentioned above and incorporated herein by reference. The FEM wafers can be exposed with randomized focus and dose variations, which help to remove systematic errors from the calibration. Any desired scheme can be used. The following examples assume a "Full Field Random" FEM (FFRFEM) scheme, where the full reticle image is exposed completely in a field. Alternatively, a Small Field Random FEM can be used, where the reticle image is partially exposed in a field.

In some embodiments the method uses a reticle which is designed for making shifted image exposures in one or more directions, similar to the methods of FIG. 12(*b*), and FIGS. 16(*a*) and (*b*). A dedicated metrology reticle can be designed for this purpose. In principle, target patterns can be defined among other patterns on a product reticle. However, the space required to permit multiple shifted exposures without overlapping would make the metrology features expensive in terms of product "real estate". Of course, different types of metrology targets can be combined on a single reticle, having a variety of designs and purposes. It would also be understood that, in the measurement of these targets, every target pair may be measured, or only a subset, according to the time constraints and metrology performance required.

Figure 18:
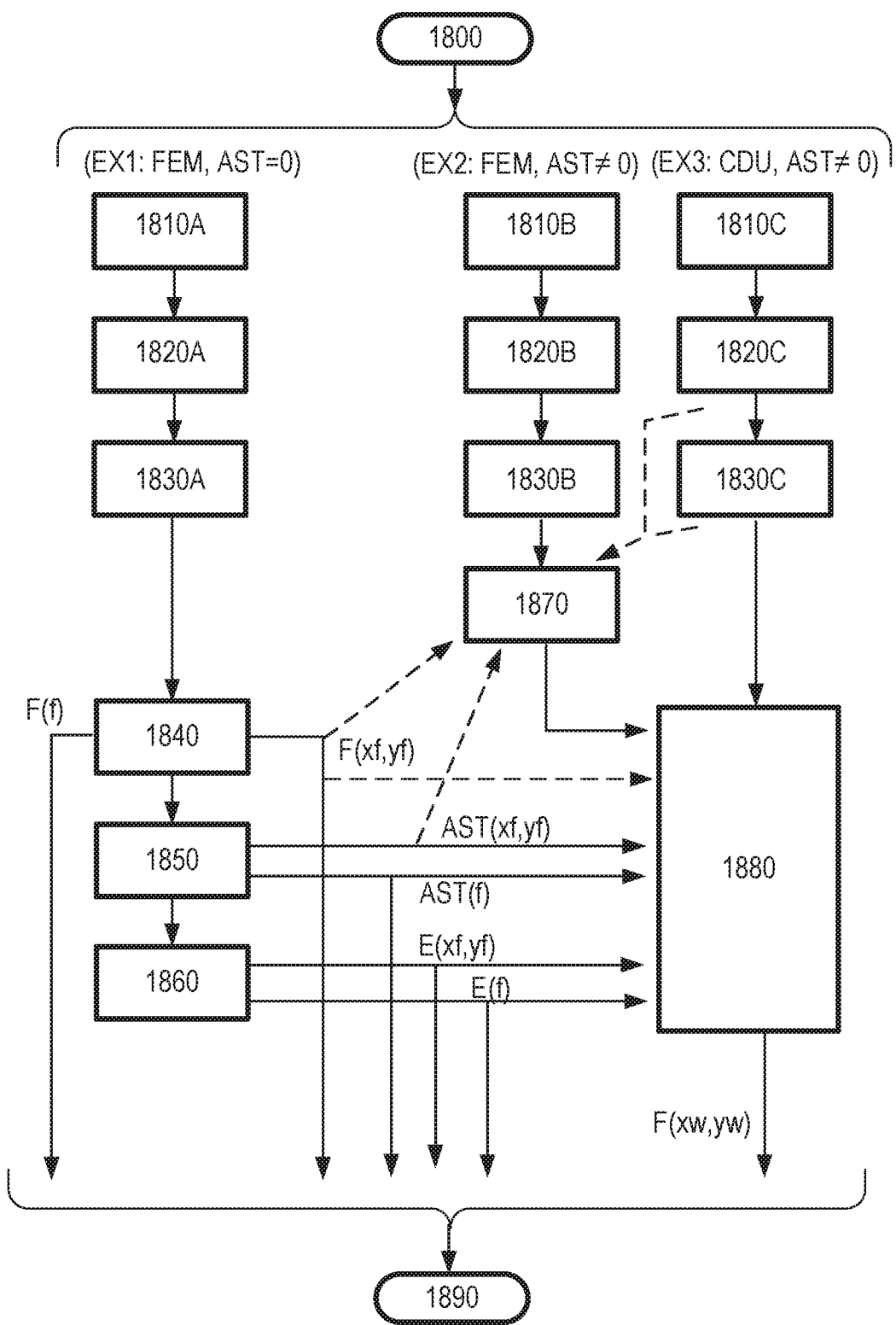
FIG. 18 is a flowchart of a method of measuring aberration fingerprints in accordance with a sixth aspect of the invention.
Figure 19:
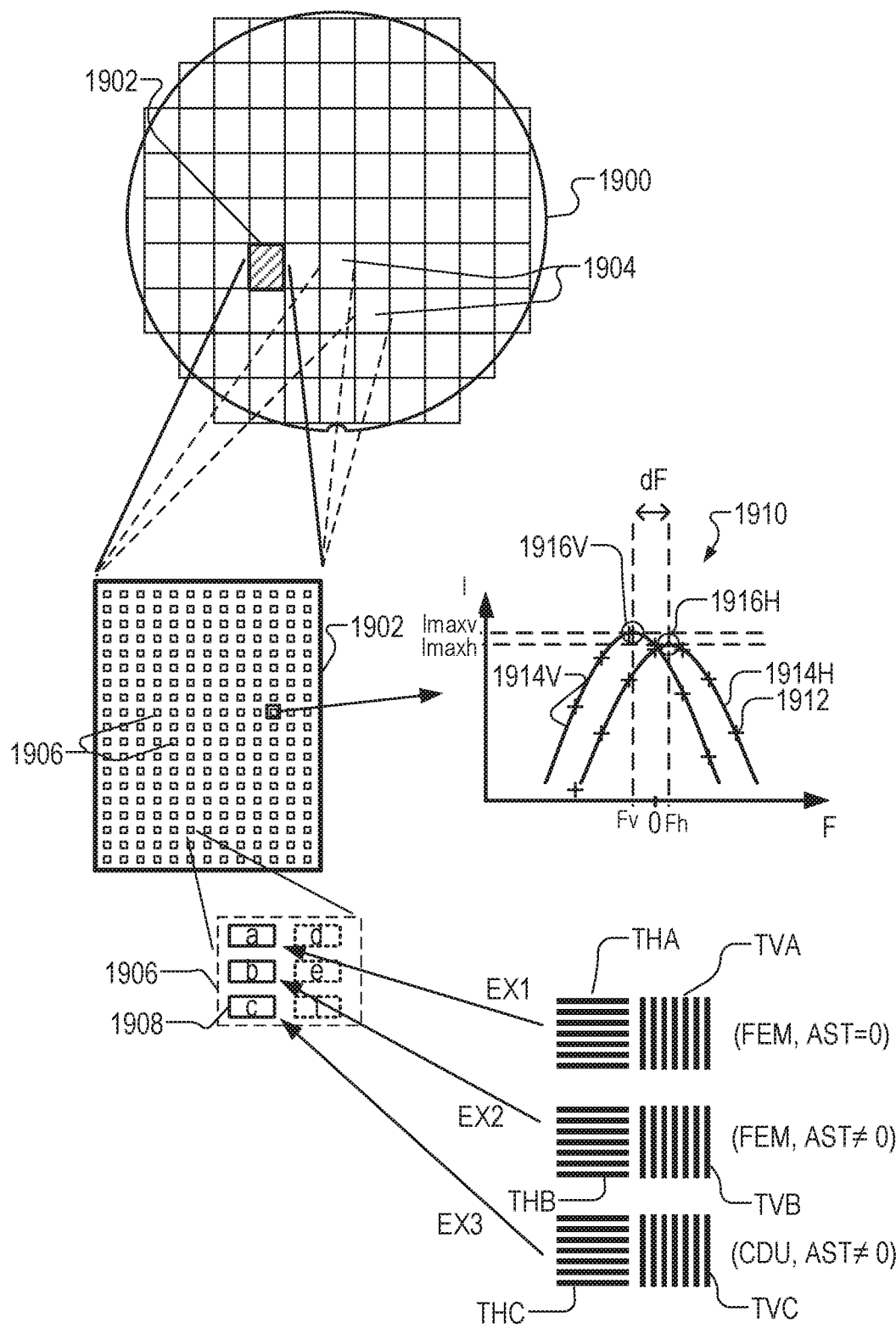
FIG. 19 illustrates schematically a possible layout of targets and multiple exposures in the method of FIG. 18.

FIG. 18 is a flowchart of the steps of a method for measuring and monitoring a focus parameter and other parameters during a lithographic process. FIG. 19 illustrates schematically the layout of a metrology substrate WM, and a pattern of target pairs TH, TV formed in a resist layer on the substrate, over a number of fields 1902, 1904.

The steps of the method are introduced briefly as follows, and are then described in greater detail thereafter:

1800—Start.

1810A—Print a first array of target pairs (TH, TV) by a first sequence of field exposures (EX1), varying focus and dose between fields 1902 in accordance with a programmed FEM offset scheme, such as FFRFEM, discussed above, but with a zero aberration setting, i.e. no astigmatism offset or other aberration setting that would be calculated to introduce a systematic best focus offset between the targets of each target pair;

1820A—Perform measurements by inspection of the first targets of each pair of targets in the first array (e.g. the TH targets) to obtain first measurement values;

1830A—Perform measurements by inspection of the second targets of each pair of targets in the first array (e.g. the TV targets) to obtain second measurement values;

1810B—Optionally, in addition to the first sequence of field exposures, print a second array of target pairs (TH, TV) adjacent the target pairs of the first array, by a second sequence of field exposures (EX2), varying focus and dose between fields 1902 in accordance with a programmed FEM offset scheme, and this time including a non-zero aberration setting calculated to introduce a best focus offset between the targets of each pair, in the manner of the ABF method, described above;

1820B—Perform measurements by inspection of the first targets of each pair of targets in the second array (e.g. the TH targets) to obtain third measurement values;

1830B—Perform measurements by inspection of the second targets of each pair of targets in the second array (e.g. the TV targets) to obtain fourth measurement values;

1810C—Optionally in addition to the first sequence of field exposures, print a third array of target pairs (TH, TV) adjacent the target pairs of the first array, by a third sequence of field exposures (EX3), this time including a non-zero aberration setting calculated to introduce a best focus offset between the targets of each pair, but keeping the focus and exposure settings constant between fields (no FEM offset scheme);

1820C—Perform measurements by inspection of the first targets of each pair of targets in the third array (e.g. the TH targets) to obtain fifth measurement values;

1830C—Perform measurements by inspection of the second targets of each pair of targets in the third array (e.g. the TV targets) to obtain sixth of measurement values;

1840—Based on the first and second measurements and knowledge of the FEM offset scheme applied in step 1810A, calculate a mean field focus error (F(f)) and an intrafield focus fingerprint F(xf, yf);

1850—Based on the first and second measurements and knowledge of the FEM offset scheme applied in step 1810A, calculate a mean field astigmatism AST(f) and an intrafield astigmatism fingerprint AST(xf, yf);

1860—Based on the first and second measurements and knowledge of the FEM offset scheme applied in step 1810A, calculate a mean field dose error E(f) and an intrafield dose fingerprint E(xf, yf);

1870—Based on the third and fourth measurements (from the second array of target pairs) and knowledge of the FEM offset scheme applied in step 1810B, and optionally based on intrafield focus fingerprint and or intrafield astigmatism fingerprints from steps 1840 and 1850, and optionally based also on the fifth and sixth measurements (from the third array of target pairs calculate a calibration curve for focus measurements by the ABF method;

1880—Based on the fifth and sixth measurements and the calibration curve from step 1870, calculate an interfield focus fingerprint F(xw, yw), optionally including corrections based on the mean focus mean field focus and/or intrafield focus fingerprint from step 1840 and/or the mean field astigmatism and/or intrafield astigmatism fingerprint from step 1850, and/or the mean field dose error and/or intrafield dose fingerprint from step 1860.

1890—End, delivering measurement results to a supervisory control system for use in subsequent exposures of product patterns and subsequent re-calibration of focus measurement methods.

For further explanation, we refer again to FIG. 19 in conjunction with the flowchart of FIG. 18. A wafer 1900 is exposed in a lithographic to using the above-mentioned reticle. In this embodiment, three images are exposed on the wafer in the same resist layer, before it is developed and measured using the scatterometer. In terms of the method, this means that the steps 1810A, 1810B, 1810C will be performed sequentially, while the same wafer remains loaded in the litho tool, and then the measurement steps 1820A etc. will be performed after the exposed wafer is transferred from the litho tool to a scatterometer. The order in which the measurements are performed, amongst themselves and among other measurements that may be being performed on the wafer, is completely a matter of implementation. If desired, the different arrays of target pairs can be formed on different substrates, or on the same substrate at different times, at the risk of introducing inconsistencies between the sets of measurements, of course. Example field 1902 is shown in enlarged form, it being understood that the same pattern is exposed in some or all of the other fields 1904. Within each field 1902, there is an array of target locations 1906, sufficient in number to measure, with a desired accuracy, intrafield fingerprints of one or more parameters of the imaging step (for example focus, dose, astigmatism or other aberration).

Within each target location 1906, there are a number of distinct areas 1908, for example 6 in the drawing, where target pairs can be placed. By applying a positional offset in the control of the placement of the pattern between different exposures EX1, EX2, EX3 etc., different target pairs THA/TVA, THB/TVB, THC/TVC general be printed without overlying one another, and develop side-by-side.

As described in FIG. 18, the three exposures in this example comprise: (EX1) an FEM image without astigmatism, (EX2) an FEM image with applied astigmatism, and (EX3) an image with applied astigmatism but no variation of exposure and dose. Depending on the space available at each target location, more exposures with different aberration settings and/or different ITEM schemes could be added, to increase the number of measurements that can be made, to measure a greater number of parameters, and/or to measure the same parameters with a greater accuracy.

From different target pairs, based on knowledge of their exposure conditions, information can be obtained, and the calculation steps described above. The principles of these measurements are illustrated in the inset graph 1910, in Which diffraction intensity 1 is plotted against a variable parameter, in this example, focus F. Considering first the measurement of intrafield focus fingerprint F(xf, yf), measurements of target pairs are used from each target location 1906 within the fields 1902, 1904, combining especially the information from fields having the same dose parameter. Next, in accordance with the known focus offsets across the FEM pattern, measurement values are (at least conceptually) plotted on the graph 1910, as shown by the sample points '+' 1912. Sample points 1912 obtained in step 1820A from first targets THA of the target pairs are used to fit a first Bossung curve 1914H, while sample points 1912 obtained in step 1830A from second targets THV of the target pairs are used to fit a second Bossung curve 1914V. The peaks of these Bossung curves are labeled 1916H and 1916V and represent the best focus positions for the differently oriented gratings at a particular target location 1906, averaged across all the fields measured.

Comparing for a moment FIG. 7, it will be recalled that an aberration offset, for example an astigmatism offset, can induce an offset dF between the best focus positions Fh and Fv of the two differently oriented gratings. Now, in the exposure EX1, no astigmatism offset is applied in step 1810A. However, in the presence of an (unwanted and unknown) astigmatism error of the litho tool, the top of the H and V Bossung curves may not be the same, as shown in the inset graph 1910 in FIG. 19. This astigmatism error may vary from time to time, known as astigmatism drift. This astigmatism error may also vary systematically across the fields 1902, 1904, this systematic variation being the intrafield fingerprint AST(xf,yf), where xf, yf represent coordinates within a field. While the sample points in the graph 1910 are measured from targets exposed with the same dose with different known focus offsets, a similar graph can be plotted using measurements of targets measured at the same focus with different dose, giving Bossung curves with dose (energy) E as the horizontal axis.

So, referring again to the calculations made in steps 1840 and 1850, measurements of the type illustrated in graph 1910 can be used as follows. The astigmatism aberration is calculated as AST=Fh−Fv, and the focus is calculated as: F=0.5*(Fh+Fv), where Fh is the focus corresponding to the top of Bossung curve 1914H measured from the first targets of each pair and Fv is the focus corresponding to the top of the Bossung curve 1914V measured from the second target of each pair. As already explained, field contains multiple target pairs at a range of target locations. By measuring all instances of the H and V gratings at the different target locations within a field, the intrafield focus and astigmatism fingerprints can be obtained. The mean focus error F(f) and the mean astigmatism AST(f)) can be calculated, for example by averaging the F and AST values measured over all the intrafield positions (xf, yf or by making a separate calculation. These measurements of focus and astigmatism can be used to monitor the drift of scanner focus and astigmatism through time, whenever the method of FIG. 18 is repeated.

As mentioned, Bossung curves can also be derived for dose variations, using different combinations of the FEM offsets. The diffraction intensity obtained by the scatterometer signal at the Bossung top is directly linked to the change of exposure dose. The scanner dose (E) and YS signal has the relation: E=φ(0.5*(Imaxh+Imaxv)), where Imaxh is the intensity at the peak of the Bossung curve for the first target of a target pair, and Imaxv is the intensity of the peak of the Bossung curve for the second target of the target pair. The function φ☐ can be determined by experiment using exposed fields having different dose. Normally, φ☐ is a linear function within a certain dose variation.

With this method, the dose at every point in the field can be determined. Therefore, the intrafield dose map E(xf, yf) of the litho tool can be obtained by the calculation at step 1860. Further, the mean dose E(f) is calculated as the average of the intrafield dose map. The mean dose can be further used to monitor the drift of scanner dose through time.

Referring now to step 1870, the second array of target pairs formed in the step 1810B (exposure EX2) are used. As mentioned, step 1810B comprises an FEM exposure with a non-zero astigmatism. These measurements are used to create a calibration curve, for subsequent ABF focus measurements, including on product wafers and/or monitoring wafers. The principle of creating the calibration curve can be found in US2016363871A1, mentioned above and incorporated herein by reference, and of course the enhanced calibration methods described above in the present disclosure can also be used. When using some of the above techniques, it will be appreciated that multiple second arrays of target pairs can be formed, using multiple non-zero astigmatism settings, for example plus and minus values, can be exposed, if desired. Three empty spaces are shown within the target location 1906 in FIG. 19, which could be used for this purpose. The principles of operation described here and described in the examples above can be combined, in such embodiments.

Referring now to step 1880, the measurements from the third array of target pairs formed in step 1810C are used to calculate an interfield focus fingerprint F(xw, yw), where xw and yw are coordinates representing position across the whole wafer. All the target pairs in the third exposure are formed with the same values of dose and focus, rather than FEM offsets. This uniform type of exposure is what might be performed for CD uniformity measurements, hence the label "CDU" in the drawing. Measurement of focus on this array is very like the examples described above, with a programmed aberration setting introducing a best focus offset between the targets of each pair. After creating the calibration curve, and calculating a dI metric, for example in the manner illustrated in FIG. 8, the focus error F at each target location across the wafer can be inferred. In order to infer the focus more accurately, the intrafield astigmatism fingerprint and drift of astigmatism which have been obtained previously in step 1850 can be used to correct focus per position. To explain, if the calibration curve is based on a certain nominal or average astigmatism value, an adjustment can be applied each sample point, according to the local variation of astigmatism has been measured in step 1850. This is similar to the techniques described above, for compensating a drift in astigmatism over time, but is applied according to variations over intrafield position. Similarly, if desired, the intrafield dose fingerprint and drift of dose obtained from step 1860 can also be used to correct focus inference. This correction can be made, for example, by measuring dose cross-talk in a similar way to the measurement of astigmatism cross-talk, described above with reference to FIG. 11. Diffraction intensities measured from the targets of the pair can be corrected for the drift of dose and/or dose fingerprint, before computing the dI metric.

Referring back to step 1870, a calibration curve can be created with the measurements obtained from the second array of targets pairs alone, or the multiple second arrays. Alternatively, a further correction can be included, by using not only the second arrays of target pairs but the measurements from the third of target pairs as well. This correction is indicated by the dashed data paths from steps 1820C and 1830C to step 1870. To explain this correction, we recall that the FEM scheme applied when exposing the second array of target pairs applies known focus offsets per field. Ideally, these focus offsets would be the only focus offsets present. However, in practice this is disturbed by the 'background focus non-uniformity' over the wafer. By using the third array of target pairs to measure this non-uniformity, obtained from a first rough calibration obtained from the second array or a previous calibration, one can correct for this and redo the calibration in step 1870. In principle this could take a number of iterations before converging, but in practice the main improvement is obtained with only one iteration.

CONCLUSION

The above techniques address a variety of problems in the measurement of focus and/or aberration performance in a lithographic manufacturing facility. The techniques can be used together or individually.

The targets are described above as line-space grating targets, as these are simple to produce and measure. However, the targets may comprise any structure which results in a Bossung curve response between a measurable target parameter and focus. For example, the targets may comprise combined horizontal and vertical line-space gratings, forming a "contact hole" arrangement. Such a target may enable more diffraction orders to be captured.

A method of manufacturing devices using the lithographic process can be improved by providing an inspection apparatus as disclosed herein, using it to measure processed substrates to measure parameters of performance of the lithographic process, and adjusting parameters of the process (particularly focus) to improve or maintain performance of the lithographic process for the processing of subsequent substrates.

The methods described can be applied without breaking design rules or producing specially modified reticle, and with reduced reliance on external methods such as FOCAL and ILIAS, mentioned above.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, this computer program may be executed for example in a separate computer system employed for the design/control process. Alternatively, the measurement process may be wholly or partly performed within unit PU in the apparatus of FIG. 3, 4 or 5 and/or the control unit LACU of FIG. 2. Similarly, an embodiment may include a computer program containing one or more sequences of machine-readable instructions describing a method of controlling the lithographic apparatus to implement the printing steps of those metrology recipes, to produce targets with the appropriate focus and aberration settings. There may also be provided a data storage medium (e.g., semiconductor memory, magnetic or optical disk) having such a computer program stored therein.

Embodiments of the invention are disclosed in the list of numbered embodiments below:

1. A method of calibrating measurements of a focus parameter of a lithographic apparatus, wherein the measurement of the focus parameter is based on measurement of at least one pair of targets printed using an aberration setting of the lithographic apparatus that induces a relative best focus offset between the targets of the pair, and being based on calibration information that expresses a relationship between said focus parameter and measurements of at least one pair of targets having a given best focus offset, said method comprising:

(a) obtaining updated calibration information by printing pairs of new calibration targets using said aberration setting in combination with different focus settings, and measuring the new calibration targets to obtain updated calibration information; and (b) identifying a drift in performance of the lithographic apparatus, based on the updated calibration information and on previously obtained calibration information, the previously obtained calibration information being obtained by measuring pairs of calibration targets printed using two or more different aberration settings so as to induce two or more different relative best focus offsets within the pairs.

2. A method according to embodiment 1 wherein the previously obtained calibration information is used to identify an anchor point, being a focus setting for which the measurement of a pair of targets is invariant over said different aberration settings.

3. A method according to embodiment 2 further comprising a step (c) of adjusting the updated calibration information to share said anchor point, and storing the adjusted updated calibration information for use in said measurements of focus performance.

4. A method according to embodiment 2 or 3 further comprising a step (d) of outputting a measurement of a drift in focus performance of the lithographic apparatus based on a deviation of the updated calibration information from said anchor point.

5. A method according to embodiment 4 wherein the previously obtained calibration information includes reference calibration information obtained using an aberration setting that is nominally the same as the aberration setting used to obtain the updated calibration information, as well as calibration information obtained using one or more different aberration settings, and wherein said measurement of drift in focus performance is based also on a slope of said reference calibration information in the vicinity of the anchor point.

6. A method according to any preceding embodiment, the method further comprising a step (e) of outputting a measurement of a drift in aberration performance, based on a comparison between the updated calibration information and the reference calibration information.

7. A method according to embodiment 6 wherein the previously obtained calibration information includes reference calibration information obtained using an aberration setting that is nominally the same as the aberration setting used to obtain the updated calibration information, as well as calibration information obtained using one or more different aberration settings, wherein the previously obtained calibration information is used to identify an anchor point, being a focus setting for which the measurement of a pair of targets is invariant over said different aberration settings, and wherein the comparison in step (e) is made after adjusting the updated calibration information to share said anchor point.

8. A method according to any preceding embodiment wherein said aberration setting is a non-zero astigmatism setting in the lithographic apparatus during printing of said calibration targets, a drift in aberration performance of the lithographic apparatus including potentially a drift in the astigmatism actually achieved by a given astigmatism setting.

9. A method according to any preceding embodiment wherein each target within a pair of calibration targets comprises line-space grating structures, the targets within a pair comprising line-space grating structures with different orientations.

10. A method according to any preceding embodiment wherein patterns defining the targets of said pairs of targets do not comprise features which introduce focus dependent asymmetry in the absence of said setting.

11. A method according to any preceding embodiment wherein said previously obtained calibration information has been obtained in association with an independent calibration of focus performance, said independent calibration not being repeated at the time of obtaining said updated calibration information.

12. A method according to embodiment 11 wherein said previously obtained calibration information has been obtained in association with an independent calibration of aberration performance, said independent calibration not being repeated at the time of obtaining said updated calibration information.

13. A method of measuring focus performance of a lithographic apparatus, said method comprising:

acquiring a first measurement value, said first measurement value having been obtained from inspection of a first target of a pair of targets;

acquiring a second measurement value, said second measurement value having been obtained from inspection of a second target of the pair of targets, wherein said first target and second target have been printed by the lithographic apparatus with an aberration setting that induces a relative best focus offset between the first target and the second target; and determining a measurement of focus performance using at least said first measurement value and said second measurement value, and using adjusted updated calibration information obtained by the method of embodiment 3 or any of embodiments 4 to 12 when dependent on embodiment 3.

14. A method according to embodiment 13 wherein said first measurement value has been obtained from a first measurement of radiation scattered from said first target and said second measurement value has been obtained from a second measurement of radiation scattered from said second target.

15. A method according to embodiment 14 wherein said first measurement is an intensity measurement of a diffraction order of radiation scattered from said first target and said second measurement is an intensity measurement of a corresponding diffraction order of radiation scattered from said second target.

16. A method according to embodiment 15 wherein said diffraction order is a higher non-zeroth) diffraction order.

17. A method according to any of embodiments 13 to 16 further comprising performing said first measurement to obtain said first measurement value and performing said second measurement to obtain said second measurement value.

18. A method according to embodiment 17 wherein said first measurement and said second measurement are performed by a single inspection step.

19. A method according to any of embodiments 13 to 18 wherein said step of determining the focus parameter comprises determining the focus parameter from a difference of said first measurement value and said second measurement value.

20. A method according to any of embodiments 13 to 19 wherein said first target and said second target comprise line-space grating structures with different orientations and wherein said aberration setting is a non-zero astigmatism setting in the lithographic apparatus during printing of said first target and said second target.

21. A method according to any of embodiments 13 to 20 further comprising, as a preliminary step, using said lithographic apparatus to form said first target and said second target on a substrate with said relative best focus offset.

22. A method according to any of embodiments 13 to 21 wherein the method is repeated at multiple locations across a substrate, thereby to measure variation of focus performance of the lithographic apparatus across the substrate.

23. A method according to any of embodiments 13 to 22 wherein the method is performed on monitoring substrates, the measurements of focus performance being used to apply focus corrections in the processing of product substrates.

24. A metrology apparatus for measuring a parameter of a lithographic process, the metrology apparatus being operable to perform the method of any of embodiments 13 to 23.

25. A metrology apparatus according to embodiment 24 comprising:
a support for said substrate having a plurality of targets thereon;
an optical system for measuring each target; and
a processor for receiving said first measurement, said second measurement and said adjusted updated calibration information and for determining said measurements of focus performance.

26. A lithographic system comprising:
a lithographic apparatus comprising:
an illumination optical system arranged to illuminate a pattern;
a projection optical system arranged to project an image of the pattern onto a substrate; and
a metrology apparatus according to embodiment 24 or 25,
wherein the lithographic apparatus is arranged to use a measurement of focus performance determined by the metrology apparatus in applying the pattern to further substrates.

27. A computer program comprising processor readable instructions which, when run on suitable processor controlled apparatus, cause the processor controlled apparatus to perform the method of any of embodiments 1 to 23, 28. A computer program carrier comprising the computer program of embodiment 27.

29. A method of manufacturing devices wherein a device pattern is applied to a series of substrates using a lithographic process, the method including:
using the method of any of embodiments 13 to 23 to monitor said focus parameter, and
controlling the lithographic process for later substrates in accordance with the determined focus parameter.

30. A method for determining a drift of one or more performance parameters associated with a lithographic process used to form structures on a substrate, the method comprising:
(a) measuring responses of a characteristic of a structure to a variation of a focus setting, said responses being determined for structures formed using at least two different aberration settings;
(b) at a later time, measuring again the response of said characteristic to variation of said focus setting for structures formed using at least one aberration setting; and
(c) determining the drift of focus performance achieved by a given focus setting and/or aberration performance achieved by a given aberration setting, using the response measured in step (b) and the responses measured in step (a).

31. A method according to embodiment 30 wherein step (a) is performed in association with an independent calibration of focus performance, said independent calibration not being repeated at the time of performing step (b).

32. A method according to embodiment 30 or 31 wherein step (a) is performed in association with an independent calibration of aberration performance, said independent calibration not being repeated at the time of performing step (b).

33. A method of monitoring a focus parameter of a lithographic apparatus, the method comprising:

receiving a first measurement value, said first measurement value having been obtained from inspection of a first target;
receiving a second measurement value, said second measurement value having been obtained from inspection of a second target,
receiving a third measurement value, said third measurement value having been obtained from inspection of a third target;
receiving a fourth measurement value, said fourth measurement value having been obtained from inspection of a fourth target; and
determining the focus parameter from at least said first, second, third and fourth measurement values,
wherein said first target and second target have been printed using a first aberration setting of the lithographic apparatus that induces a relative best focus offset between the targets,
wherein said third target and fourth target have been printed using a second aberration setting of the lithographic apparatus that has a different sign than the first aberration setting,
and wherein the first, second, third and fourth measurement values are combined, so as to determine said focus parameter in a manner that is insensitive to a drift in aberration performance of the lithographic apparatus.

34. A method according to embodiment 33 wherein each measurement value has been obtained from a measurement of radiation scattered from the corresponding target.

35. A method according to embodiment 36 wherein each measurement represents an intensity of a diffraction order of radiation scattered from the corresponding target.

36. A method according to embodiment 35 wherein said diffraction order is a higher (non-zeroth) diffraction order.

37. A method according to any of embodiments 33 to 36 comprising performing inspection of said first, second, third and fourth targets to obtain said first, second, third and fourth measurement values.

38. A method according to embodiment 37 wherein at least said first measurement and said second measurement are performed by a single inspection step.

39. A method according to any of embodiments 33 to 38 wherein said step of determining the focus parameter uses a difference between said first measurement value and said second measurement value combined with a difference between said third measurement value and said fourth measurement value.

40. A method according to embodiment 39 wherein said difference of said first measurement value and said second measurement value is normalized in proportion with said first measurement value and said second measurement value and said difference of said third measurement value and said fourth measurement value is normalized in proportion with said third measurement value and said fourth measurement value.

41. A method according to any of embodiments 33 to 40 wherein the step of determining the focus parameter uses said measurement values in combination with calibration information obtained by prior measurement of calibration targets printed with a range of focus settings.

42. A method according to any of embodiments 33 to 41 wherein the first and second aberration settings are non-zero astigmatism settings in the lithographic apparatus, astigmatism in the printing of said targets inducing a relative best focus offset between features oriented differently.

43. A method according to any of embodiments 33 to 42 comprising printing said first target and said second target on a substrate using said first aberration setting and printing said third target and fourth target on the same substrate or on a different substrate using said second aberration setting.

44. A method according to embodiment 43 wherein the step of printing said first target and said second target and the step of printing said third target and fourth target are performed by printing a target pattern twice on the same substrate, changing the aberration setting and adding a positional offset so that the third and fourth targets are adjacent but offset from the first and second targets.

45. A method according to embodiment 44 wherein the step of printing said first target and said second target and the step of printing said third target and fourth target are performed by printing the same target pattern twice in the same resist material.

46. A method according to any of embodiments 33 to 45 wherein said first, second, third and fourth targets each comprise line-space grating structures.

47. A method according to any of embodiments 33 to 46 further comprising:
receiving a fifth measurement value, said fifth measurement value having been obtained from inspection of a fifth target;
receiving a sixth measurement value, said sixth measurement value having been obtained from inspection of a sixth target,
receiving a seventh measurement value, said seventh measurement value having been obtained from inspection of a seventh target; and
receiving an eighth measurement value, said eighth measurement value having been obtained from inspection of a eighth target;
wherein said fifth target and sixth target have been printed using said first aberration setting of the lithographic apparatus, while being different in design from the first and second targets,
wherein said seventh target and eighth target have been printed using said second aberration setting of the lithographic apparatus while being different in design from the third and fourth targets,
and wherein the step of determining the focus parameter additionally uses at least said fifth, sixth, seventh and eighth measurement values.

48. A method according to any of embodiments 33 to 47 wherein said first, second, third, fourth, fifth, sixth, seventh and eighth targets each comprise line-space grating structures.

49. A method according to embodiment 48 wherein the first, second, third, fourth targets are designed to have a first line-space width ratio and the designs of said fifth, sixth, seventh and eighth targets are designed to have a second line-space width ratio.

50. A method according to embodiment 49 wherein the first line-space width ratio is a reciprocal of the second line-space width ratio.

51. A method according to embodiment 48, 49 or 50 wherein the first, second, third, fourth targets are designed to have a first spatial period and the designs of said fifth, sixth, seventh and eighth targets are designed to have a second spatial period.

52. A method according to any of embodiments 33 to 51 wherein patterns defining the targets of said pairs of targets do not comprise features which introduce focus dependent asymmetry in the absence of said setting.

53. A method according to any of embodiments 33 to 52 further comprising, as preliminary steps,
using said lithographic apparatus to print said first target and second target using said first aberration setting; and
using said lithographic apparatus to print said third target and fourth target using said second aberration setting, 54. A method of monitoring a focus parameter of a lithographic apparatus, the method comprising:
receiving a first measurement value, said first measurement value having been obtained from inspection of a first target;
receiving a second measurement value, said second measurement value having been obtained from inspection of a second target; and
determining the focus parameter from at least said first and second measurement values,
wherein said first target has been printed using a first focus offset relative to a best focus setting of the lithographic apparatus,
wherein said second target has been printed using a second focus offset relative to the best focus setting of the lithographic apparatus,
and wherein said first target and said second target have been printed by printing a target pattern two times in the same resist layer on a substrate, changing a focus offset and adding a positional offset so that the second target is adjacent but offset from the first target.

55. A method according to embodiment 53 wherein each measurement value has been obtained from a measurement of radiation scattered from the corresponding target.

56. A method according to embodiment 55 wherein each measurement represents an intensity of a diffraction order of radiation scattered from the corresponding target.

57. A method according to embodiment 56 wherein said diffraction order is a higher (non-zeroth) diffraction order.

58. A method according to any of embodiments 54 to 57 comprising performing inspection of said first and second targets to obtain said first and second measurement values.

59. A method according to embodiment 58 wherein at least said first measurement and said second measurement are obtained by a single inspection step.

60. A method according to any of embodiments 54 to 59 wherein said step of determining the focus parameter uses a difference between said first measurement value and said second measurement value.

61. A method according to any of embodiments 54 to 61 further comprising:
receiving a third measurement value, said third measurement value having been obtained from inspection of a third target;
receiving a fourth measurement value, said fourth measurement value having been obtained from inspection of a fourth target; and
using said third and fourth measurement values together with first and second measurement values when determining said focus parameter,
wherein said third target has been printed in the same printing step as the first target, using the first focus offset,
wherein said fourth target has been printed in the same printing step as the first target, using the second focus offset,
and wherein said target pattern and positional offset are such that the second and fourth targets are adjacent but offset from the first and third targets.

62. A method according to any of embodiments 54 to 61 wherein said first, second, third and fourth targets each comprise line-space grating structures, and wherein lines in the first and third targets are oriented orthogonally to lines in the first and second targets.

63. A method according to embodiment 61 or 62 wherein said step of determining the focus parameter uses a difference between (i) a sum or average of said first measurement value and said third measurement value and (ii) a sum or average of said second measurement value and said fourth measurement value.

64. A method according to embodiment 61 or 62 wherein said step of determining the focus parameter uses a difference between said first measurement value and said second measurement value combined with a difference between said third measurement value and said fourth measurement value.

65. A method according to any of embodiments 61 to 64 wherein the step of determining the focus parameter uses said measurement values in combination with calibration information obtained by prior measurement of calibration targets printed with a range of focus settings.

66. A method according to any of embodiments 62 to 65 further comprising a step of:
using at least said first, second, third and fourth measurement values to determine an aberration parameter of the lithographic apparatus.

67. A method according to embodiment 66 wherein said step of determining the aberration parameter uses a difference between (i) a difference between said first measurement value and said third measurement value and (ii) a difference between said second measurement value and said fourth measurement value.

68. A method according to embodiment 66 or 67 wherein said aberration parameter is astigmatism.

69. A method according to any of embodiments 61 to 68 further comprising performing inspection of said first, second, third and fourth targets to obtain said first, second, third and fourth measurement values.

70. A method according to any of embodiments 54 to 69 further comprising:
receiving a fifth measurement value, said fifth measurement value having been obtained from inspection of a fifth target;
receiving a sixth measurement value, said sixth measurement value having been obtained from inspection of a sixth target,
receiving a seventh measurement value, said seventh measurement value having been obtained from inspection of a seventh target; and
receiving an eighth measurement value, said eighth measurement value having been obtained from inspection of an eighth target;
wherein said fifth target and seventh target have been printed in the same printing step as said first and third targets using said first focus offset, while being different in design from the first and third targets,
wherein said sixth target and eighth target have been printed in the same printing step as said second and fourth targets using said second focus offset while being different in design from the second and fourth targets,
and wherein the step of determining the focus parameter additionally uses at least said fifth, sixth, seventh and eighth measurement values.

71. A method according to embodiment 70 wherein said first, second, third, fourth, fifth, sixth, seventh and eighth targets each comprise line-space grating structures and wherein the first, second, third, fourth targets are designed to have a first line-space width ratio and the designs of said fifth, sixth, seventh and eighth targets are designed to have a second line-space width ratio.

72. A method according to embodiment 71 wherein the first line-space width ratio is a reciprocal of the second line-space width ratio.

73. A method according to embodiment 70, 71 or 72 wherein said first, second, third, fourth, fifth, sixth, seventh and eighth targets each comprise line-space grating structures and wherein the first, second, third, fourth targets are designed to have a first spatial period and the designs of said fifth, sixth, seventh and eighth targets are designed to have a second spatial period.

74. A method according to any of embodiments 56 to 60 further comprising:
receiving a first additional measurement value, said first additional measurement value having been obtained from inspection of a first additional target;
receiving a second additional measurement value, said second additional measurement value having been obtained from inspection of a second additional target,
wherein said first additional target has been printed in the same printing step as said first target using said first focus offset, while being different in design from the first target,
wherein said second additional target has been printed in the same printing step as said second target using said second focus offset, while being different in design from the second target,
and wherein the step of determining the focus parameter additionally uses at least said first and second additional measurement values.

75. A method according to embodiment 74 wherein said first target, said second target, said first additional target and said second additional target each comprise line-space grating structures and wherein the first and second targets are designed to differ from the first and second additional targets in spatial period and/or line-space width ratio.

76. A method according to any of embodiments 54 to 75 wherein patterns defining said targets do not comprise features which introduce focus dependent asymmetry in the individual targets.

77. A method according to any of embodiments 54 to 76 wherein the step of determining the focus parameter uses said measurement values in combination with calibration information obtained by prior measurement of calibration targets printed with a range of focus settings.

78. A method according to any of embodiments 54 to 77 wherein said first focus offset is of opposite polarity to said second focus offset.

79. A method according to embodiment 78 wherein said second focus offset is equal and opposite to the first focus offset.

80. A method according to any of embodiments 54 to 79 further comprising, as a preliminary step, using said lithographic apparatus to print said first target and said second target on said substrate by printing said target pattern two times in the same resist layer on the substrate, changing the focus offset and adding a positional offset so that the second target is adjacent but offset from the first target.

81. A method according to any of embodiments 33 to 80 Wherein the method is repeated at multiple locations across a substrate, thereby to measure variation of focus performance of the lithographic apparatus across the substrate.

82. A method according to any of embodiments 33 to 81 wherein the method is performed on monitoring substrates, the measurements of focus performance being used to apply focus corrections in the processing of product substrates.

83. A metrology apparatus for measuring a parameter of a lithographic process, the metrology apparatus being operable to perform the method of any of embodiments 33 to 79.

84. A metrology apparatus according to embodiment 83 comprising:
a support for said substrate having a plurality of targets thereon;
an optical system for measuring each target; and
a processor.

85. A lithographic system comprising:
a lithographic apparatus comprising:
an illumination optical system arranged to illuminate a pattern;
a projection optical system arranged to project an image of the pattern onto a substrate; and
a metrology apparatus according to embodiment 83 or 84,
wherein the lithographic apparatus is arranged to use the focus parameter determined by the metrology apparatus in applying the pattern to further substrates.

86. A computer program comprising processor readable instructions which, when run on suitable processor controlled apparatus, cause the processor controlled apparatus to perform the method of any of embodiments 33 to 79.

87. A computer program carrier comprising the computer program of embodiment 86.

88. A method of manufacturing devices wherein a device pattern is applied to a series of substrates using a lithographic process, the method including:
using the method of any of embodiments 33 to 80 to monitor said focus parameter, and
controlling the lithographic process for later substrates in accordance with the determined focus parameter.

89. A method of measuring an aberration parameter of a lithographic apparatus, the method comprising:
receiving a first measurement value, said first measurement value having been obtained from inspection of a first target;
receiving a second measurement value, said second measurement value having been obtained from inspection of a second target;
receiving a third measurement value, said third measurement value having been obtained from inspection of a third target;
receiving a fourth measurement value, said fourth measurement value having been obtained from inspection of a fourth target; and
determining the aberration parameter from at least said first, second, third and fourth measurement values,
wherein said first and third targets have been formed by printing said target pattern a first time in a resist layer on a substrate using a first focus offset relative to a best focus setting of the lithographic apparatus,
and wherein said second and fourth targets have been formed by printing said target pattern a second time in the same resist layer using a second focus offset relative to the best focus setting of the lithographic apparatus, adding a positional offset so that the first, second, third and fourth targets are adjacent one another on the substrate.

90. A method according to embodiment 89 wherein each measurement value has been obtained from a measurement of radiation scattered from the corresponding target.

91. A method according to embodiment 90 wherein each measurement value represents an intensity of a diffraction order of radiation scattered from the corresponding target.

92. A method according to embodiment 91 wherein said diffraction order is a higher (non-zeroth) diffraction order.

93. A method according to any of embodiments 89 to 91 comprising perforating inspection of first, second, third and fourth targets to obtain said first, second, third and fourth measurement values.

94. A method according to any of embodiments 89 to 93 wherein said first, second, third and fourth targets each comprise line-space grating structures, and wherein lines in the first and third targets are oriented orthogonally to lines in the second and fourth targets.

95. A method according to embodiment 93 94 wherein said step of determining the aberration parameter uses a difference between (i) a difference between said first measurement value and said third measurement value and (ii) a difference between said second measurement value and said fourth measurement value.

96. A method according to any of embodiments 89 to 95 wherein said aberration parameter is astigmatism.

97. A method according to any of embodiments 89 to 96 further comprising performing inspection of said first, second, third and fourth targets to obtain said first, second, third and fourth measurement values.

98. A method according to embodiment 97 wherein at least two of said first, second, third and fourth measurements are obtained by a single inspection step.

99. A method according to any of embodiments 89 to 98 further comprising:
receiving a fifth measurement value, said fifth measurement value having been obtained from inspection of a fifth target;
receiving a sixth measurement value, said sixth measurement value having been obtained from inspection of a sixth target,
receiving a seventh measurement value, said seventh measurement value having been obtained from inspection of a seventh target; and
receiving an eighth measurement value, said eighth measurement value having been obtained from inspection of an eighth target;
wherein said fifth target and seventh target have been printed in the same printing step as said first and third targets using said first focus offset, while being different in design from the first and third targets,
wherein said sixth target and eighth target have been printed in the same printing step as said second and fourth targets using said second focus offset while being different in design from the second and fourth targets,
and wherein the step of determining the aberration parameter additionally uses at least said fifth, sixth, seventh and eighth measurement values.

100. A method according to embodiment 99 wherein said first, second, third, fourth, fifth, sixth, seventh and eighth targets each comprise line-space grating structures and wherein the first, second, third, fourth targets are designed to have a first line-space width ratio and the designs of said fifth, sixth, seventh and eighth targets are designed to have a second line-space width ratio.

101. A method according to embodiment 100 wherein the first line-space width ratio is a reciprocal of the second line-space width ratio.

102. A method according to embodiment 99, 100 or 101 wherein said first, second, third, fourth, fifth, sixth, seventh and eighth targets each comprise line-space grating structures and wherein the first, second, third, fourth targets are designed to have a first spatial period and the designs of said fifth, sixth, seventh and eighth targets are designed to have a second spatial period.

103. A method according to any of embodiments 89 to 102 wherein patterns defining said targets do not comprise features which introduce focus dependent asymmetry in the individual targets.

104. A method according to any of embodiments 89 to 103 wherein said first focus offset is of opposite polarity to said second focus offset.

105. A method according to embodiment 104 wherein said second focus offset is equal and opposite to the first focus offset.

106. A method according to any of embodiments 89 to 105 further comprising, as a preliminary step, using said lithographic apparatus to print said first, second third and fourth targets in a resist layer on said substrate by printing said target pattern two times in the same resist layer, changing the focus offset and adding a positional offset so that the first, second, third and fourth targets are adjacent one another on the substrate.

107. A method according to any of embodiments 89 to 106 wherein the method is repeated at multiple locations across a substrate, thereby to measure variation of aberration parameter of the lithographic apparatus across the substrate.

108. A method according to any of embodiments 89 to 107 wherein the method is performed on monitoring substrates, the measurements of said aberration parameter being used to apply corrections in the processing of product substrates.

109. A metrology apparatus for measuring a parameter of a lithographic process, the metrology apparatus being operable to perform the method of any of embodiments 89 to 108.

110. A metrology apparatus according to embodiment 107 comprising:
a support for said substrate having a plurality of targets thereon;
an optical system for measuring each target; and
a processor.

111. A lithographic system comprising:
a lithographic apparatus comprising:
an illumination optical system arranged to illuminate a pattern;
a projection optical system arranged to project an image of the pattern onto a substrate; and
a metrology apparatus according to embodiment 107 or 108,
wherein the lithographic apparatus is arranged to use the aberration parameter determined by the metrology apparatus in applying the pattern to further substrates.

112. A computer program comprising processor readable instructions which, when run on suitable processor controlled apparatus, cause the processor controlled apparatus to perform the method of any of embodiments 89 to 108.

113. A computer program carrier comprising the computer program of embodiment 112

114. A method of manufacturing devices wherein a device pattern is applied to a series of substrates using a lithographic process, the method including:
using the method of any of embodiments 89 to 108 to monitor said focus parameter, and
controlling the lithographic process for later substrates in accordance with the determined focus parameter.

115. A method of measuring an imaging parameter of a lithographic apparatus, the method comprising:
receiving a set of first measurement values, each of said first measurement values having been obtained by inspection of a respective one of a set of first targets;
receiving a set of second measurement values, each of said second measurement values having been obtained by inspection of a respective one of a set of second targets; and
determining the imaging parameter based on at least said first set and second set of measurement values,
wherein said set of first targets and said set of second targets have been formed by printing at least a first array of target pairs in a resist layer on a substrate, each target pair comprising a first target and a second target at substantially the same target location, different target pairs of the first array of target pairs having been printed at different target locations across the substrate,
and wherein the step of determining said imaging parameter uses the first and second measurement values combined with knowledge of different imaging settings used by the lithographic apparatus when printing said different target pairs at said different target locations.

116. A method according to embodiment 115 wherein each measurement value has been obtained from a measurement of radiation scattered from the corresponding target.

117. A method according to embodiment 116 wherein each measurement value represents an intensity of a diffraction order of radiation scattered from the corresponding target.

118. A method according to embodiment 117 wherein said diffraction order is a higher (non-zeroth) diffraction order.

119. A method according to any of embodiments 115 to 118 further comprising performing inspection of sets of first targets and second targets to obtain said sets of first measurement values and second measurement values.

120. A method according to any of embodiments 115 to 119 wherein said first targets and second targets each comprise line-space grating structures, and wherein lines in the first targets are oriented orthogonally to lines in the second targets.

121. A method according to any of embodiments 115 to 120 wherein said step of determining the imaging parameter includes fitting a first Bossung curve to said first measurement values and a second Bossung curve to said second measurement values, based on said knowledge of different imaging settings used in printing each target pair, and deriving said imaging parameter based.

122. A method according to embodiment 121 wherein said imaging parameter is a first imaging parameter and the method further comprises deriving a further imaging parameter is derived based on combining one or more properties of the first Bossung curve with one or more properties of the second Bossung curve in a different way, to that used in deriving the first imaging parameter.

123. A method according to any of embodiments 115 to 122 wherein the target pairs of said first array have been printed in fields across the substrate, different fields having different known imaging settings, and wherein said imaging parameter is calculated for one or more specific intrafield positions based on measurement values obtained from corresponding intrafield positions within different fields.

124. A method according to embodiment 122 or 123 wherein the target pairs of said first array have been printed in fields across the substrate, said imaging parameter being determined as an average value over a field, based on a combination of measurement values obtained from multiple intrafield positions within different fields.

125. A method according to embodiment 123 and 124 combined, wherein field average value and intrafield values are derived for said imaging parameter, based on said sets of first and second measurement values.

126. A method according to any of embodiments 115 to 125 wherein at least one imaging parameter determined by the method is focus.

127. A method according to any of embodiments 115 to 126 wherein at least one imaging parameter determined by the method is astigmatism.

128. A method according to any of embodiments 115 to 127 wherein at least one imaging parameter determined by the method is exposure dose.

129. A method according to any of embodiments 115 to 128 further comprising:
receiving a set of third measurement values, each of said third measurement values having been obtained by inspection of a respective one of a set of third targets;
receiving a set of fourth measurement values, each of said fourth measurement values having been obtained by inspection of a respective one of a set of fourth targets;
wherein said set of third targets and said set of fourth targets have been formed by printing at least a second array of target pairs in the same or another resist layer on the same or another substrate, each target pair of the second array comprising a third target and a fourth target at substantially the same target location, different target pairs of the second array of target pairs having been printed at different target locations across the substrate, using an aberration setting of the lithographic apparatus that induces a relative best focus offset between the targets of each target pair within the second array,
the method further comprising determining calibration information for measuring an imaging parameter on further substrates based on at least said sets of third and fourth measurement values.

130. A method according to embodiment 129 wherein said calibration information is calculated with corrections based on intrafield and/or field average of the same or other imaging parameters determined from said sets of first and second measurement values.

131. A method according to any of embodiments 115 to 130 further comprising:
receiving a set of fifth measurement values, each of said fifth measurement values having been obtained by inspection of a respective one of a set of fifth targets;
receiving a set of sixth measurement values, each of said sixth measurement values having been obtained by inspection of a respective one of a set of sixth targets;
wherein said set of fifth targets and said set of sixth targets have been formed by printing at least a third array of target pairs in the same or another resist layer on the same or another substrate, each target pair of the third array comprising a fifth target and a sixth target at substantially the same target location, different target pairs of the first array of target pairs being printed at different target locations across the substrate with uniform imaging settings,
the method further comprising determining at least one further imaging parameter based on at least said fifth set and sixth set of measurement values, and including corrections based on intrafield and/or field average of the same or other imaging parameters determined from said sets of first and second measurement values.

132. A method according to embodiment 131 wherein said at least one further imaging parameter is interfield focus variation.

133. A method according to any of embodiments 115 to 132 wherein patterns defining said targets do not comprise features which introduce focus dependent asymmetry in the individual targets.

134. A method according to any of embodiments 115 to 133 further comprising performing inspection of said first, second sets of target, said third and fourth targets where present, and said fifth and sixth sets of targets where present, to obtain said first and second sets of measurement values and/or said third and fourth sets of measurement values, and/or said fifth and sixth said sets of measurement values.

135. A method according to any of embodiments 115 to 134 further comprising, as a preliminary step, using said lithographic apparatus to print said first and second sets of target together with at least one of said third and fourth sets of targets, and said fifth and sixth sets of targets in a resist layer on said substrate by printing said target pattern one or more times in the same resist layer, changing the imaging setting and adding a positional offset so that the first, second, third and fourth targets are adjacent one another on the substrate.

136. A method according to any of embodiments 115 to 135 wherein the method is performed on monitoring substrates, the measurements of said imaging parameter being used to apply corrections in the processing of product substrates.

137. A metrology apparatus for measuring one or more imaging parameters of a lithographic apparatus, the metrology apparatus being operable to perform the method of any of embodiments 115 to 136.

138. A metrology apparatus according to embodiment 137 comprising:
a support for said substrate having a plurality of targets thereon;
an optical system for measuring each target; and
a processor. 139. A lithographic system comprising:
a lithographic apparatus comprising:
an illumination optical system arranged to illuminate a pattern;
a projection optical system arranged to project an image of the pattern onto a substrate; and
a metrology apparatus according to embodiment 137 or 138,
wherein the lithographic apparatus is arranged to use the aberration parameter determined by the metrology apparatus in applying the pattern to further substrates.

140. A computer program comprising processor readable instructions which, when run on suitable processor controlled apparatus, cause the processor controlled apparatus to perform the method of any of embodiments 115 to 136.

141. A computer program carrier comprising the computer program of embodiment 140.

142. A method of manufacturing devices wherein a device pattern is applied to a series of substrates using a lithographic process, the method including:
using the method of any of embodiments 115 to 136 to monitor said focus parameter, and
controlling the lithographic process for later substrates in accordance with the determined focus parameter.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of monitoring a focus parameter of a lithographic apparatus, the method comprising:
receiving a first measurement value, the first measurement value having been obtained from inspection of a first target;
receiving a second measurement value, the second measurement value having been obtained from inspection of a second target; and
determining the focus parameter from at least the first and second measurement values,
wherein the first target has been printed using a first focus offset relative to a best focus setting of the lithographic apparatus,
wherein the second target has been printed using a second focus offset relative to the best focus setting of the lithographic apparatus,
and wherein the first target and the second target have been printed by printing a target pattern two times in the same resist layer on a substrate, changing a focus offset and adding a positional offset so that the second target is adjacent but offset from the first target.

2. The method of claim 1, wherein each measurement value has been obtained from a measurement of radiation scattered from the corresponding target and wherein each measurement represents an intensity of a diffraction order of radiation scattered from the corresponding target.

3. The method of claim 2, wherein the diffraction order is a non-zeroth diffraction order.

4. The method of claim 1, comprising performing inspection of the first and second targets to obtain the first and second measurement values.

5. The method of claim 4, wherein at least the first measurement and the second measurement are obtained by a single inspection step.

6. The method of claim 1, wherein the step of determining the focus parameter uses a difference between the first measurement value and the second measurement value.

7. The method of claim 1, further comprising:
receiving a third measurement value, the third measurement value having been obtained from inspection of a third target;
receiving a fourth measurement value, the fourth measurement value having been obtained from inspection of a fourth target; and
using the third and fourth measurement values together with the first and second measurement values when determining the focus parameter,
wherein the third target has been printed in the same printing step as the first target, using the first focus offset,
wherein the fourth target has been printed in the same printing step as the first target, using the second focus offset,
and wherein the target pattern and positional offset are such that the second and fourth targets are adjacent but offset from the first and third targets.

8. The method of claim 7, wherein the first, second, third, and fourth targets each comprise line-space grating structures, and wherein lines in the first and third targets are oriented orthogonally to lines in the first and second targets.

9. The method of claim 7, wherein the step of determining the focus parameter uses a difference between (i) a sum or average of the first measurement value and the third measurement value and (ii) a sum or average of the second measurement value and the fourth measurement value.

10. The method of claim 7, wherein the step of determining the focus parameter uses a difference between the first measurement value and the second measurement value combined with a difference between the third measurement value and the fourth measurement value.

11. The method of claim 7, further comprising a step of:
using at least the first, second, third, and fourth measurement values to determine an aberration parameter of the lithographic apparatus.

12. The method of claim 11, wherein the step of determining the aberration parameter uses a difference between (i) a difference between the first measurement value and the third measurement value and (ii) a difference between the second measurement value and the fourth measurement value.

13. The method of claim 7, further comprising:
receiving a fifth measurement value, the fifth measurement value having been obtained from inspection of a fifth target;
receiving a sixth measurement value, the sixth measurement value having been obtained from inspection of a sixth target,
receiving a seventh measurement value, the seventh measurement value having been obtained from inspection of a seventh target; and
receiving an eighth measurement value, the eighth measurement value having been obtained from inspection of an eighth target;
wherein the fifth target and seventh target have been printed in the same printing step as the first and third targets using the first focus offset, while being different in design from the first and third targets,
wherein the sixth target and eighth target have been printed in the same printing step as the second and fourth targets using the second focus offset while being different in design from the second and fourth targets,
and wherein the step of determining the focus parameter additionally uses at least the fifth, sixth, seventh and eighth measurement values.

14. The method of claim 13, wherein the first, second, third, fourth, fifth, sixth, seventh and eighth targets each comprise line-space grating structures and wherein the first, second, third, and fourth targets are designed to have a first line-space width ratio and the designs of the fifth, sixth, seventh, and eighth targets are designed to have a second line-space width ratio.

15. The method of claim 14, wherein the first line-space width ratio is a reciprocal of the second line-space width ratio.

* * * * *

UNITED STATES PATENT AND TRADEMARK OFFICE
CERTIFICATE OF CORRECTION

PATENT NO. : 10,571,812 B2
APPLICATION NO. : 16/045979
DATED : February 25, 2020
INVENTOR(S) : Li et al.

Page 1 of 1

It is certified that error appears in the above-identified patent and that said Letters Patent is hereby corrected as shown below:

In the Claims

In Column 59, Lines 49-50, replace "the first measurement and the second measurement" with --the first measurement value and the second measurement value--.

In Column 60, Lines 27-28, replace "uses a difference between (i) a difference between" with --uses (i) a difference between--.

In Column 60, Line 51, replace "the second focus offset while" with --the second focus offset, while--.

In Column 60, Line 57, replace "sixth, seventh and eighth targets" with --sixth, seventh, and eighth targets--.

In Column 60, Lines 60-61, replace "and the designs of the fifth, sixth, seventh, and eighth targets are designed" with --and the fifth, sixth, seventh, and eighth targets are designed--.

Signed and Sealed this
Fourth Day of August, 2020

Andrei Iancu
*Director of the United States Patent and Trademark Office*